United States Patent
Morise et al.

(10) Patent No.: US 7,714,399 B2
(45) Date of Patent: May 11, 2010

(54) MAGNETIC MEMORY ELEMENT AND MAGNETIC MEMORY APPARATUS

(75) Inventors: Hirofumi Morise, Kanagawa-ken (JP);
Shiho Nakamura, Kanagawa-ken (JP);
Satoshi Yanagi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 333 days.

(21) Appl. No.: 11/902,510

(22) Filed: Sep. 21, 2007

(65) Prior Publication Data

US 2008/0197431 A1 Aug. 21, 2008

(30) Foreign Application Priority Data

Feb. 15, 2007 (JP) .............................. 2007-034486

(51) Int. Cl.
*H01L 29/82* (2006.01)
*H01L 43/00* (2006.01)

(52) U.S. Cl. .............................. 257/421; 257/E43.001; 257/E29.167; 257/E29.323; 365/158

(58) Field of Classification Search ................. 257/421, 257/E43.001, E29.167, E29.323; 365/158
See application file for complete search history.

(56) References Cited

U.S. PATENT DOCUMENTS

| | | | |
|---|---|---|---|
| 6,304,477 B1 | 10/2001 | Naji | |
| 6,829,162 B2 | 12/2004 | Hosotani | |
| 6,914,807 B2 | 7/2005 | Nakamura et al. | |
| 6,914,810 B2 | 7/2005 | Hosotani | |
| 7,633,795 B2* | 12/2009 | Shimomura et al. | 365/158 |
| 2003/0112655 A1 | 6/2003 | Hosotani | |
| 2003/0227807 A1 | 12/2003 | Nakamura et al. | |
| 2005/0002230 A1 | 1/2005 | Hosotani | |
| 2006/0132990 A1 | 6/2006 | Morise et al. | |

FOREIGN PATENT DOCUMENTS

| | | |
|---|---|---|
| JP | 2002-334585 | 11/2002 |
| JP | 2003-179213 | 6/2003 |
| JP | 2004-006775 | 1/2004 |
| JP | 2005-259206 | 9/2005 |
| JP | 2006-203064 | 8/2006 |

OTHER PUBLICATIONS

Office Action dated Sep. 18, 2009 in JP 2007-034486 and English-language translation thereof.

* cited by examiner

*Primary Examiner*—Tu-Tu V Ho
(74) *Attorney, Agent, or Firm*—Nixon & Vanderhye, PC

(57) ABSTRACT

A magnetic memory element includes a laminated construction of an electrode, a first pinned layer, a first intermediate layer, a first memory layer, a second intermediate layer, a second memory layer, a third intermediate layer, a second pinned layer and electrode. The magnetization direction of the first memory layer takes a first and a second directions and that of the second memory layer takes a third and a fourth directions corresponding to a value and polarity of a current between the electrodes. In response to the current, the second intermediate layer has an electric resistance higher than the first intermediate layer and than the third intermediate layer.

7 Claims, 37 Drawing Sheets

DURING STANDBY

AT READING

MAGNETIC MEMORY ELEMENT AND MAGNETIC MEMORY APPARATUS

CROSS-REFERENCE TO RELATED APPLICATIONS

This application is based upon and claims the benefit of priority from the prior Japanese Patent Application No. 2007-34486, filed on Feb. 15, 2007; the entire contents of which are incorporated herein by reference.

BACKGROUND OF THE INVENTION

1. Field of the Invention

This invention relates to a magnetic memory element based on the magnetoresistance effect and a magnetic memory apparatus including the magnetic memory elements.

2. Background Art

Recently, there has been a growing demand for information processing devices that meet various needs as an underpinning and engine for the extensively and highly advanced information society. In particular, hard disk drives and magnetoresistive random access memory (MRAM) are memory devices based on the magnetic moment of ferromagnets. Such spin-electronics devices using the spin degree of freedom of electrons are characterized in being suitable to increasing integration by downsizing cells, operable at high speed, and nonvolatile. Hence their use will further expand in memory apparatuses and other applications.

In one method for controlling the magnetization direction of small magnetic bodies in spin-electronics devices, the current-induced spin transfer phenomenon is used. The "spin transfer" refers to the transfer of angular momentum from the spin of conduction electrons to the localized magnetic moment of the magnetic bodies. In contrast to the scheme based on magnetic field application, the spin transfer scheme is characterized in that the write current can be reduced with the downsizing of cells.

The magnetic memory element adapted to spin transfer writing is illustratively shaped like a pillar. More specifically, it includes a lamination film composed of a magnetization-pinned magnetic layer (hereinafter also referred to as "pinned layer"), an intermediate layer, and a magnetization-free magnetic layer (hereinafter also referred to as "memory layer"). The lamination film is patterned with dots, each being tens to hundreds of nanometers square. Both the pinned layer and the memory layer are magnetized in the direction within the film plane. By passing a current through this lamination film in the direction perpendicular to the film plane, the magnetization direction can be controlled (write) and detected (read), and the element can be used as a memory element.

Here, one memory element can include a plurality of memory layers, and each memory layer can independently serve for recording, storing, and reading of data.

Several publications (U.S. Pat. No. 6,304,477, JP-A 2002-334585 (Kokai), and JP-A 2005-259206 (Kokai)) disclose incorporating such memory elements into a circuit to form a CAM (content addressable memory). The CAM, also called "associative memory", is a functional memory capable of comparing a first data (bit string) with a second data (bit string) and rapidly outputting a determination as to whether they are matched. There is a great demand for CAMs in routers and caches. Besides CAMs, a magnetic memory capable of multivalued operation has been disclosed (JP-A 2006-203064 (Kokai)).

SUMMARY OF THE INVENTION

According to an aspect of the invention, there is provided a magnetic memory element including: a first pinned layer including ferromagnetic material and having a fixed magnetization direction; a second pinned layer including ferromagnetic material and having a fixed magnetization direction; a first memory layer provided between the first pinned layer and the second pinned layer, including ferromagnetic material, and having a variable magnetization direction; a second memory layer provided between the first memory layer and the second pinned layer, including ferromagnetic material, and having a variable magnetization direction; a first intermediate layer provided between the first pinned layer and the first memory layer and made of nonmagnetic material; a second intermediate layer provided between the first memory layer and the second memory layer and made of nonmagnetic material; a third intermediate layer provided between the second memory layer and the second pinned layer and made of nonmagnetic material; and a pair of electrodes electrically connected to pass a current between the first pinned layer and the second pinned layer, the magnetization direction of the first memory layer taking a first direction when the current exceeds a first threshold in a first polarity, and taking a second direction opposite to the first direction when the current exceeds a second threshold in a second polarity, the magnetization direction of the second memory layer taking a third direction when the current exceeds a third threshold having a smaller absolute value than the first threshold in the first polarity, and taking a fourth direction when the current exceeds a fourth threshold having a smaller absolute value than the second threshold in the second polarity, and in response to the current, the second intermediate layer having an electric resistance higher than the first intermediate layer and than the third intermediate layer.

According to another aspect of the invention, there is provided a magnetic memory element including: a first pinned layer including ferromagnetic material and having a fixed magnetization direction; a second memory layer including ferromagnetic material and having a variable magnetization direction; a first memory layer provided between the first pinned layer and the second memory layer, including ferromagnetic material, and having a variable magnetization direction; a first intermediate layer provided between the first pinned layer and the first memory layer and made of nonmagnetic material; a second intermediate layer provided between the first memory layer and the second memory layer and made of nonmagnetic material; a pair of electrodes electrically connected to pass a current between the first pinned layer and the second memory layer; and a magnetic field application section for applying magnetic field to the second memory layer, the magnetization direction of the first memory layer taking a first direction when the current exceeds a first threshold in a first polarity, and taking a second direction opposite to the first direction when the current exceeds a second threshold in a second polarity, and the magnetization direction of the second memory layer being changed to one of a third direction and a fourth direction depending on the magnetic field applied by the magnetic field application section without changing the magnetization direction of the first memory layer.

According to another aspect of the invention, there is provided a magnetic memory element including: a first pinned layer including ferromagnetic material and having a fixed magnetization direction; a second pinned layer including ferromagnetic material and having a fixed magnetization direction; a first memory layer provided between the first pinned layer and the second pinned layer, including ferromagnetic material, and having a variable magnetization direction; a second memory layer provided between the first memory layer and the second pinned layer, including ferromagnetic material, and having a variable magnetization direction; a first intermediate layer provided between the first pinned layer and the first memory layer and made of nonmagnetic material; a second intermediate layer provided between the first memory layer and the second memory layer and made of nonmagnetic material; a third intermediate layer provided between the second memory layer and the second pinned layer and made of nonmagnetic material; a pair of electrodes electrically connected to pass a current between the first pinned layer and the second pinned layer; and a magnetic field application section for applying magnetic field to the second memory layer, the magnetization direction of the first memory layer taking a first direction when the current exceeds a first threshold in a first polarity, and taking a second direction opposite to the first direction when the current exceeds a second threshold in a second polarity, and the magnetization direction of the second memory layer taking one of a third direction and a fourth direction depending on the current and the magnetic field applied by the magnetic field application section.

According to another aspect of the invention, there is provided a magnetic memory apparatus including: a plurality of word lines; a plurality of bit lines; and a plurality of the magnetic memory elements, the magnetic memory element including: a first pinned layer including ferromagnetic material and having a fixed magnetization direction; a second pinned layer including ferromagnetic material and having a fixed magnetization direction; a first memory layer provided between the first pinned layer and the second pinned layer, including ferromagnetic material, and having a variable magnetization direction; a second memory layer provided between the first memory layer and the second pinned layer, including ferromagnetic material, and having a variable magnetization direction; a first intermediate layer provided between the first pinned layer and the first memory layer and made of nonmagnetic material; a second intermediate layer provided between the first memory layer and the second memory layer and made of nonmagnetic material; a third intermediate layer provided between the second memory layer and the second pinned layer and made of nonmagnetic material; and a pair of electrodes electrically connected to pass a current between the first pinned layer and the second pinned layer, the magnetization direction of the first memory layer taking a first direction when the current exceeds a first threshold in a first polarity, and taking a second direction opposite to the first direction when the current exceeds a second threshold in a second polarity, the magnetization direction of the second memory layer taking a third direction when the current exceeds a third threshold having a smaller absolute value than the first threshold in the first polarity, and taking a fourth direction when the current exceeds a fourth threshold having a smaller absolute value than the second threshold in the second polarity, and in response to the current, the second intermediate layer having an electric resistance higher than the first intermediate layer and than the third intermediate layer.

According to another aspect of the invention, there is provided a magnetic memory apparatus including: a plurality of word lines; a plurality of bit lines; and a plurality of the magnetic memory elements, the magnetic memory element including: a first pinned layer including ferromagnetic material and having a fixed magnetization direction; a second memory layer including ferromagnetic material and having a variable magnetization direction; a first memory layer provided between the first pinned layer and the second memory layer, including ferromagnetic material, and having a variable magnetization direction; a first intermediate layer provided between the first pinned layer and the first memory layer and made of nonmagnetic material; a second intermediate layer provided between the first memory layer and the second memory layer and made of nonmagnetic material; a pair of electrodes electrically connected to pass a current between the first pinned layer and the second memory layer; and a magnetic field application section for applying magnetic field to the second memory layer, the magnetization direction of the first memory layer taking a first direction when the current exceeds a first threshold in a first polarity, and taking a second direction opposite to the first direction when the current exceeds a second threshold in a second polarity, and the magnetization direction of the second memory layer being changed to one of a third direction and a fourth direction depending on the magnetic field applied by the magnetic field application section without changing the magnetization direction of the first memory layer.

According to another aspect of the invention, there is provided a magnetic memory apparatus including: a plurality of word lines; a plurality of bit lines; and a plurality of the magnetic memory elements, the magnetic memory element including: a first pinned layer including ferromagnetic material and having a fixed magnetization direction; a second pinned layer including ferromagnetic material and having a fixed magnetization direction; a first memory layer provided between the first pinned layer and the second pinned layer, including ferromagnetic material, and having a variable magnetization direction; a second memory layer provided between the first memory layer and the second pinned layer, including ferromagnetic material, and having a variable magnetization direction; a first intermediate layer provided between the first pinned layer and the first memory layer and made of nonmagnetic material; a second intermediate layer provided between the first memory layer and the second memory layer and made of nonmagnetic material; a third intermediate layer provided between the second memory layer and the second pinned layer and made of nonmagnetic material; a pair of electrodes electrically connected to pass a current between the first pinned layer and the second pinned layer; and a magnetic field application section for applying magnetic field to the second memory layer, the magnetization direction of the first memory layer taking a first direction when the current exceeds a first threshold in a first polarity, and taking a second direction opposite to the first direction when the current exceeds a second threshold in a second polarity, and the magnetization direction of the second memory layer taking one of a third direction and a fourth direction depending on the current and the magnetic field applied by the magnetic field application section.

DETAILED DESCRIPTION OF THE INVENTION

Embodiments of the invention will now be described in detail with reference to the drawings.

First Embodiment

Figure 1A:
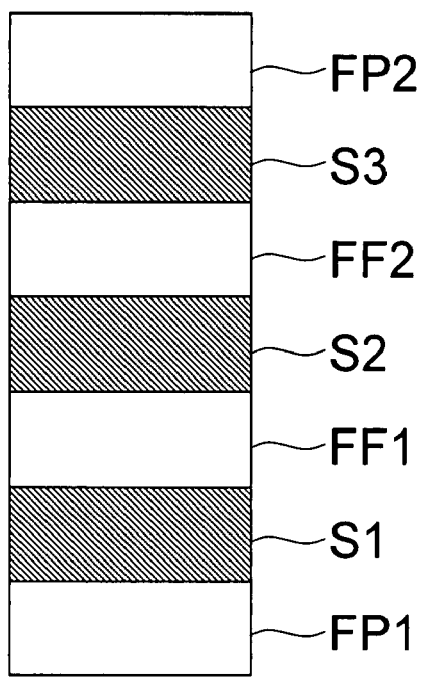
FIGS. 1A and 1B are schematic views showing a magnetic memory element according to a first embodiment of the invention.
Figure 1B:
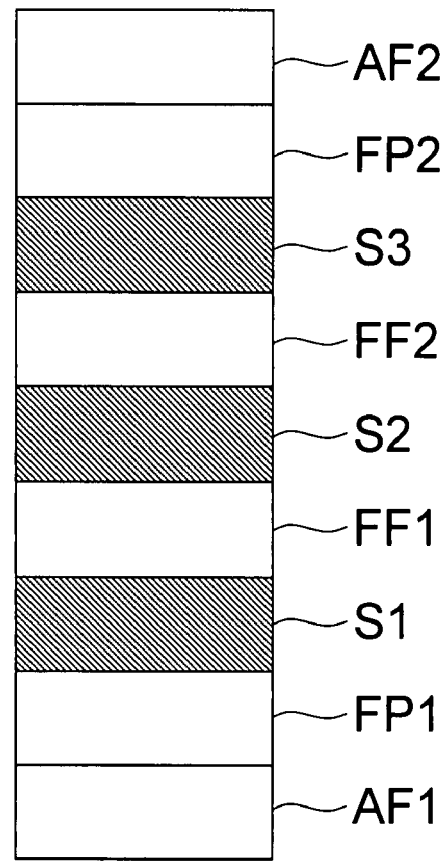

FIGS. 1A and 1B are schematic views showing the cross-sectional structure of a magnetic memory element according to a first embodiment of the invention.

The magnetic memory element R has a structure in which a ferromagnetic layer FP1, a nonmagnetic layer S1, a ferromagnetic layer FF1, a nonmagnetic layer S2, a ferromagnetic layer FF2, a nonmagnetic layer S3, and a ferromagnetic layer FP2 are laminated in this order. The ferromagnetic layers FP1, FP2, FF1, and FF2 may have a laminated structure composed of a plurality of sublayers as described later. However, a description is first given of an example where each of the ferromagnetic layers FP1, FP2, FF1, and FF2 is a monolayer.

The ferromagnetic layer FP1 has a pinned magnetization direction. This can be realized, for example, by providing an antiferromagnetic layer AF1 on the opposite side of the nonmagnetic layer S1 across the ferromagnetic layer FP1 as shown in FIG. 1B, or by forming the ferromagnetic layer FP1 from a magnetic material having a very high uniaxial anisotropy constant Ku. The ferromagnetic layer FP1 is hereinafter also referred to as "first pinned layer".

On the other hand, the ferromagnetic layer FP2 also has a pinned magnetization direction. This can also be realized, for example, by providing an antiferromagnetic layer AF2 on the opposite side of the nonmagnetic layer S3 across the ferromagnetic layer FP2 as shown in FIG. 1B, or by forming the ferromagnetic layer FP2 from a magnetic material having a very high uniaxial anisotropy constant Ku. The ferromagnetic layer FP2 is hereinafter also referred to as "second pinned layer".

In contrast, the ferromagnetic layers FF1 and FF2 are not provided with this mechanism for pinning magnetization. That is, the ferromagnetic layers FF1 and FF2 have a variable magnetization direction. Hereinafter, the ferromagnetic layer FF1 is also referred to as "first memory layer", and the ferromagnetic layer FF2 is also referred to "second memory layer".

On the other hand, each of the nonmagnetic layers S1, S2, and S3 is made of nonmagnetic material, and has a thickness large enough to isolate the two ferromagnetic layers sandwiching the nonmagnetic layer so that the direct interaction between the two ferromagnetic layers is negligible. Furthermore, the thickness of the nonmagnetic layers S1, S2, and S3 needs to be smaller than the spin diffusion length so that, when a current is passed through the magnetic memory element R, the spin direction of conduction electrons that have passed through one ferromagnetic layer is not inverted until reaching the other ferromagnetic layer. The nonmagnetic layers S1, S2, and S3 can be made of nonmagnetic metal, nonmagnetic semiconductor, insulator, or other materials as described later in detail. The nonmagnetic layers S1, S2, and S3 are hereinafter also referred to as "intermediate layers".

Electrodes EL1 and EL2 are connected to the pinned layers FP1 and FP2, respectively, and a current can be passed between EL1 and EL2.

The magnetic memory apparatus of this embodiment is configured so that the magnetoresistance effect through the nonmagnetic layer S2 is greater than the magnetoresistance effect through the nonmagnetic layer S1 and than the magnetoresistance effect through the nonmagnetic layer S3 when a current is passed between the electrodes EL1 and EL2. Hence, typically, the electric resistance in the direction between the electrodes EL1 and EL2 is larger in the nonmagnetic layer S2 than in the nonmagnetic layer S1 and than in the nonmagnetic layer S3.

The magnetic memory element R is fabricated using the sputtering and lithography technique, for example, as described later with reference to working examples.

Next, the write operation to the first memory layer of the magnetic memory element R is described.

FIG. 2 is a schematic view showing the write operation to the first memory layer. With regard to FIG. 2 and the following figures, elements similar to those described earlier with reference to the previous figures are marked with the same reference numerals and not described in detail.

Figure 2A:
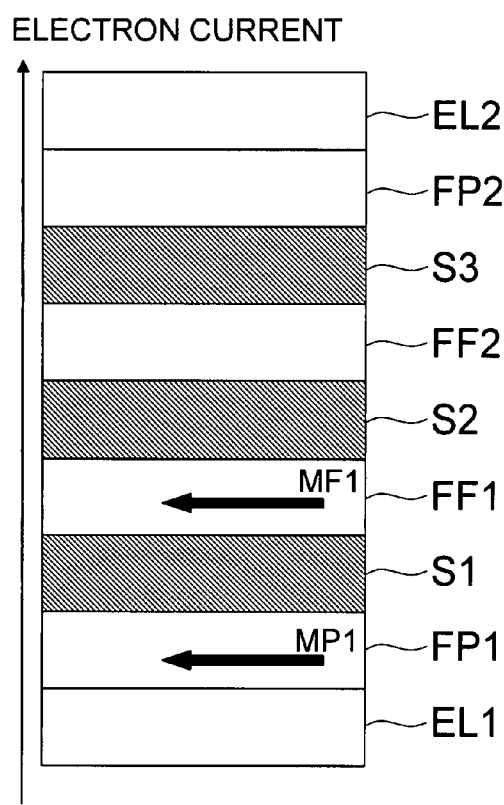
FIG. 2 is a schematic view showing the write operation to the first memory layer.
Figure 2B:
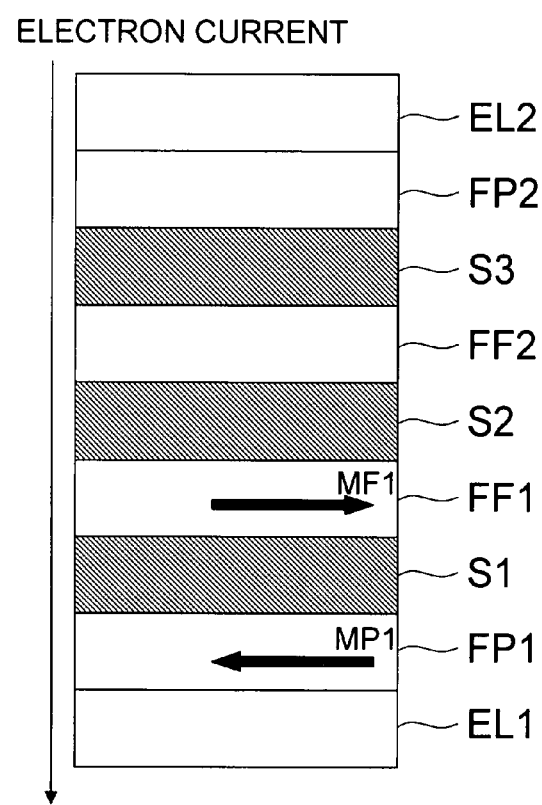

As shown in FIG. 2A, when a current larger than a threshold Ic1 is passed in a direction such that electrons flow from the electrode EL1 toward the electrode EL2, the magnetization MF1 of the memory layer FF1 is directed parallel to the magnetization MP1 of the pinned layer FP1 under the action of the spin-polarized current. On the contrary, as shown in FIG. 2B, when a current larger than a threshold Ic2 is passed in a direction such that electrons flow from the electrode EL2 toward the electrode EL1, the magnetization MF1 of the memory layer FF1 is directed antiparallel to the magnetization MP1 of the pinned layer FP1 under the action of the spin-polarized current. That is, two different states can be written to the first memory layer FF1 of the magnetic memory element R by introducing currents with different polarities. The magnetization MF2 of the memory layer FF2 may be directed in either direction during or after the writing to the memory layer FF1.

Next, the write operation to the second memory layer of the magnetic memory element R is described.

FIG. 3 is a schematic view showing the write operation to the second memory layer.

Figure 3A:
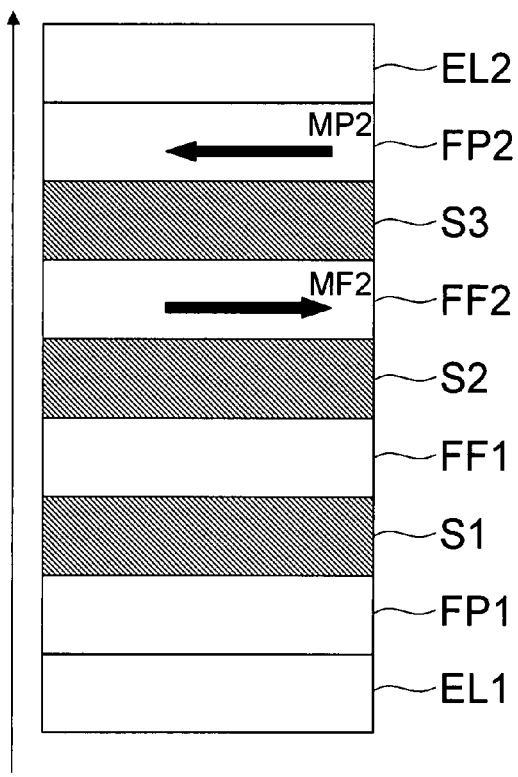
FIG. 3 is a schematic view showing the write operation to the second memory layer.
Figure 3B:
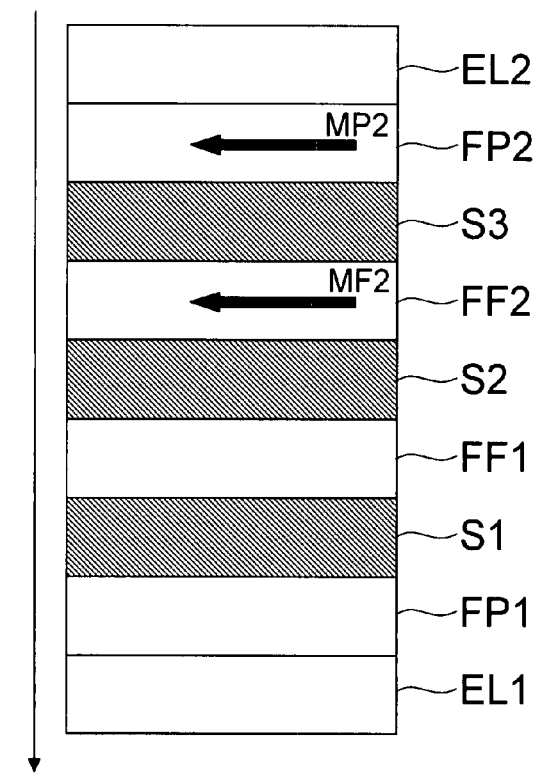

As shown in FIG. 3A, when a current larger than a threshold Ic3 and smaller than Ic1 is passed in a direction such that electrons flow from the electrode EL1 toward the electrode EL2, the magnetization MF2 of the memory layer FF2 is directed antiparallel to the magnetization MP2 of the pinned layer FP2 under the action of the spin-polarized current. On the contrary, as shown in FIG. 3B, when a current larger than a threshold Ic4 and smaller than Ic2 is passed in a direction such that electrons flow from the electrode EL2 toward the electrode EL1, the magnetization MF2 of the memory layer FF2 is directed parallel to the magnetization MP2 of the pinned layer FP2. That is, two different states can be written also to the second memory layer FF2 of the magnetic memory element R by introducing currents with different polarities.

When the thresholds of write currents are set as described above, the magnetization direction MF1 of the first memory layer FF1 is not affected by the write operation to the second memory layer FF2.

Next, a description is given of the match detection operation for the magnetic memory element R between the data bit stored as the magnetization direction of the first memory layer FF1 and the data bit stored as the magnetization direction of the second memory layer FF2.

Figure 4A:
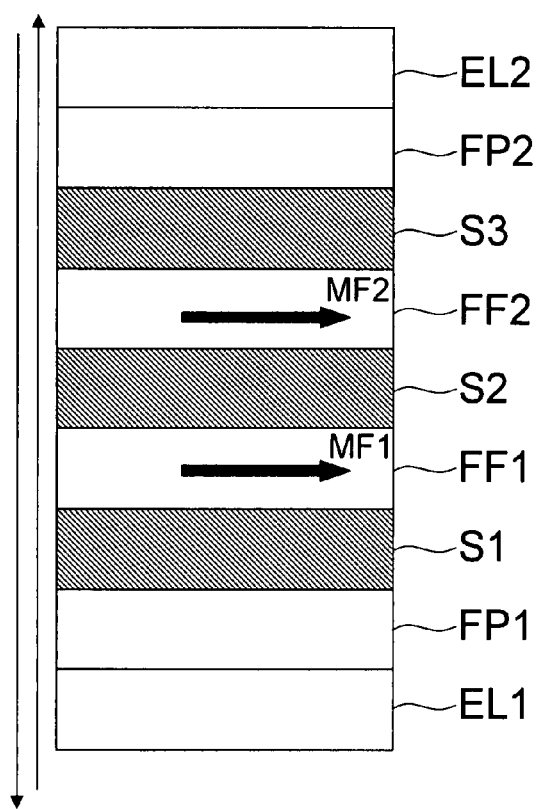
FIG. 4 is a schematic view showing the match detection operation for data bits by the magnetoresistance effect.
Figure 4B:
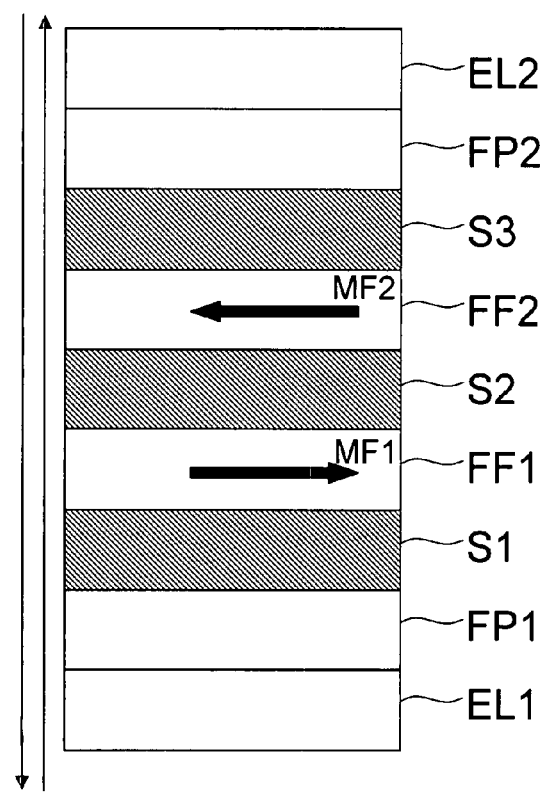

When a sense current is passed in a direction such that electrons flow from the electrode EL1 toward the electrode EL2, or when a sense current is passed in a direction such that electrons flow from the electrode EL2 toward the electrode EL1, electric resistance depends, by the so-called magnetoresistance effect, on the relative angle between the direction of magnetization MF1 of the memory layer FF1 and the direction of magnetization MF2 of the memory layer FF2. Typically, electric resistance is low when these magnetizations MF1 and MF2 are parallel as shown in FIG. 4A, and electric resistance is high when these magnetizations MF1 and MF2 are antiparallel as shown in FIG. 4B. Hence the match detection operation for data bits can be performed by detecting the electric resistance.

The electric resistance in the direction between the electrodes EL1 and EL2 is preferably larger in the nonmagnetic layer S2 than in the nonmagnetic layer S1 and than in the nonmagnetic layer S3 so that the magnetoresistance effect through the nonmagnetic layer S2 is greater than the magnetoresistance effect through the nonmagnetic layer S1 and than the magnetoresistance effect through the nonmagnetic layer S3 when a current is passed between the electrodes EL1 and EL2. To this end, the nonmagnetic body S2 can be made of insulator, and the nonmagnetic bodies S1 and S3 can be made of metal or semiconductor, or insulator having a higher conductivity than the nonmagnetic body S2.

This match detection operation may be adapted to only one current polarity, or may be adapted to both current polarities. In the former case, the match detection operation is performed after the write operation to the second memory layer FF2. That is, the match detection operation can be performed without changing the state of magnetization MF1 of the first memory layer FF1 and the state of the magnetization MF2 of the second memory layer FF2 if a current smaller than the threshold Ic3 is passed in a direction such that electrons flow from the electrode EL1 toward the electrode EL2 or if a current smaller than the threshold Ic4 is passed in a direction such that electrons flow from the electrode EL2 toward the electrode EL1.

On the other hand, to adapt to both current polarities, the match detection operation may be performed after writing to the second memory layer FF2, or may be performed simultaneously with writing. The match detection operation can be performed simultaneously with writing to the second memory layer FF2 without changing the magnetization state of the first memory layer FF1 if a current larger than the threshold Ic3 and smaller than Ic1 is passed in a direction such that electrons flow from the electrode EL1 toward the electrode EL2 or if a current larger than the threshold Ic4 and smaller than Ic2 is passed in a direction such that electrons flow from the electrode EL2 toward the electrode EL1.

The stable magnetization directions of the memory layers FF1 and FF2 are preferably parallel or antiparallel to each other. As long as this condition is satisfied, the stable magnetization direction of the ferromagnetic layers FP1, FP2, FF1, and FF2 can be arbitrary. For example, the magnetization direction of these ferromagnetic layers may be within the film plane or perpendicular to the film plane. The magnetization directions of the pinned layers FP1 and FP2 may be parallel or antiparallel to each other.

Figure 5:
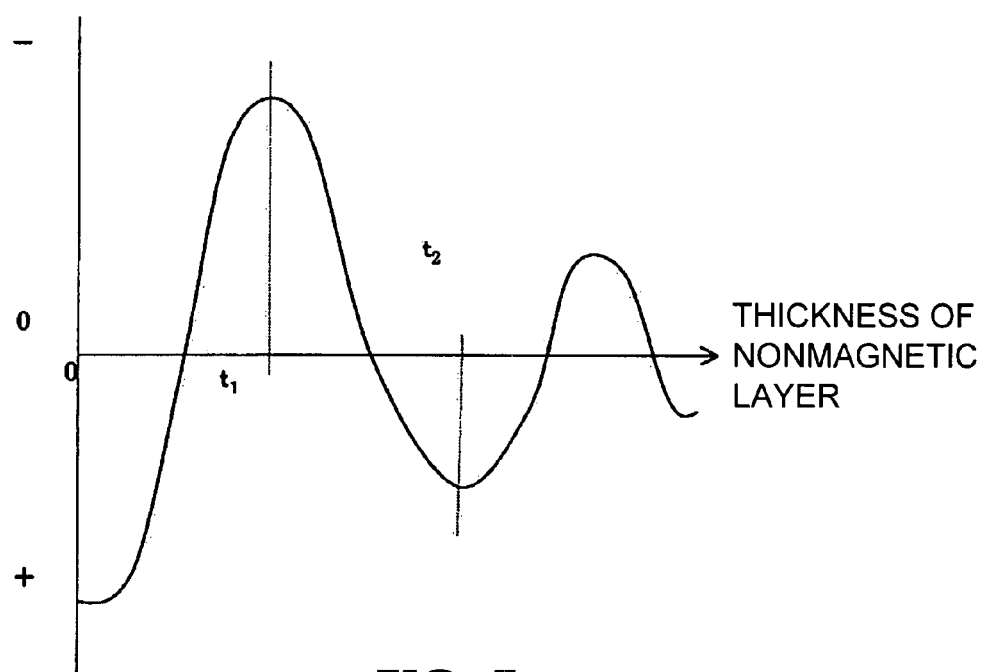
FIG. 5 is a graph illustrating exchange coupling between two ferromagnetic layers through a nonmagnetic layer.

On the other hand, each of the ferromagnetic layers FP1, FP2, FF1, and FF2 can have a multilayer structure including two or more ferromagnetic sublayers and one or more nonmagnetic sublayers. More specifically, as schematically shown in FIG. 5, exchange coupling between the two ferromagnetic layers through a nonmagnetic layer oscillates between positive and negative with respect to the thickness of the nonmagnetic layer. Hence, if the thickness of the nonmagnetic sublayer is set to correspond to any one of the positive (or negative) peak positions in FIG. 5, the exchange coupling between the adjacent ferromagnetic sublayers on both sides can be configured to be ferromagnetic (antiferromagnetic).

When the first pinned layer FP1 includes two or more ferromagnetic sublayers, the magnetization direction of each of the ferromagnetic sublayers satisfies the same condition as in the case where the first pinned layer FP1 is a monolayer. The magnetization direction of the first pinned layer FP1 refers to the magnetization direction of the ferromagnetic sublayer nearest to the intermediate layer S1 among the ferromagnetic sublayers included in the first pinned layer FP1.

This also applies to the second pinned layer FP2. When the second pinned layer FP2 includes two or more ferromagnetic sublayers, the magnetization direction of each of the ferromagnetic sublayers satisfies the same condition as in the case where the pinned layer FP2 is a monolayer. The magnetization direction of the pinned layer FP2 refers to the magnetization direction of the ferromagnetic sublayer nearest to the intermediate layer S3 among the ferromagnetic sublayers included in the pinned layer FP2.

On the other hand, also when the memory layer FF1 includes two or more ferromagnetic sublayers, the magnetization direction of each of the ferromagnetic sublayers satisfies the same condition as in the case where the memory layer FF1 is a monolayer. When the memory layer FF2 includes two or more ferromagnetic sublayers, the magnetization direction of each of the ferromagnetic sublayers satisfies the same condition as in the case where the memory layer FF2 is a monolayer. The magnetization direction of the first memory layer FF1 described above with regard to writing to the first memory layer FF1 refers to the magnetization direction of the ferromagnetic sublayer nearest to the intermediate layer S1 among the ferromagnetic sublayers constituting the first memory layer FF1. Likewise, the magnetization direction of the second memory layer FF2 described above with regard to writing to the second memory layer FF2 refers to the magnetization direction of the ferromagnetic sublayer nearest to the intermediate layer S3 among the ferromagnetic sublayers constituting the second memory layer FF2.

The magnetization direction of the memory layers FF1 and FF2 described above with regard to the method for match detection refers to the magnetization direction of the ferromagnetic sublayer nearest to the intermediate layer S2 among the ferromagnetic sublayers constituting the respective layers. The magnetization direction of the other ferromagnetic sublayers is uniquely determined because it is determined by whether the exchange coupling between the adjacent ferromagnetic sublayers is ferromagnetic or antiferromagnetic.

Here, comparison is made with the multivalued memory element described in the above-mentioned patent document, JP-A 2006-203064 (Kokai). In the memory element described in JP-A 2006-203064 (Kokai), if the first memory layer and the second memory layer have different switching current thresholds, writing to the first memory layer (having a relatively large switching current) unfortunately involves unintentional writing to the second memory layer (having a relatively small switching current). In contrast, as described above, the magnetic memory element of this embodiment has no problem in the operation if writing to the first memory layer involves writing to the second memory layer.

Furthermore, in the magnetic memory element of this embodiment, the data retention time of the second memory layer may be shorter than the data retention time of the first memory layer. More specifically, it only needs to be longer the time from when data is written until the match detection operation is completed. Hence, to reduce the write current threshold of the second memory layer, it is possible to choose the material of the second memory layer from options including magnetic materials thermally less stable than the first memory layer. This advantageously facilitates increasing the difference of switching current thresholds between the first memory layer and the second memory layer. By increasing the difference of the switching current thresholds, cross-talk between the first and second memory layers during the data writing can be suppressed. More specifically, undesired data writing in the first memory layer during a data writing in the second memory layer can be suppressed.

Moreover, the embodiment has features which the conventional multivalued memory does not include. For example, in the case of the element shown in FIG. 1A, three magnetoresistance effect elements are included, each of which has the intermediate layer S1, S2, and S3, respectively. In the case of the conventional multivalued memory element, it is necessary to read four values. For this reason, one (hereinafter referred to as magnetoresistance effect element MR1) of the three magnetoresistance effect elements should have a sufficiently smaller resistance change than the other two (MR2, MR3). Hence R1L can be considered to be nearly equal to R1H, and four states can be detected by the combination of the resistance change of MR2 and the resistance change of MR3. That is, $\Delta R2 > \Delta R3 \gg \Delta R1$ or $\Delta R3 > \Delta R2 \gg \Delta R1$ must be satisfied. Here, R1L is a resistance of the magnetoresistance effect element MR1 at its lower resistance state, and R1H is a resistance of the magnetoresistance effect element MR1 at its higher resistance state. $\Delta R1$ is defined as R1H-R1L, $\Delta R2$ is defined as R2H-R2L, and $\Delta R3$ is defined as R3H-R3L.

A typical example is configured by forming the intermediate layer S2 from an insulating layer, the intermediate layer S3 (or S1) from an insulating layer having lower resistance, and the intermediate layer S1 (or S3) from metal or other material having even lower resistance. Here, the intermediate layers S1, S2 and S3 do not necessarily correspond to the magnetoresistance effect element MR1, MR2 and MR3, respectively.

In contrast, in the magnetic memory element of this embodiment, it is only necessary to read two values indicating whether the data of the first memory layer matches that of the second memory layer. For this reason, among the three magnetoresistance effect elements, the resistance change due to the magnetoresistance effect through the intermediate layer S1 and the resistance change due to the magnetoresistance effect through the intermediate layer S3 are made sufficiently smaller than the resistance change due to the magnetoresistance effect through the intermediate layer S2. Hence R1L can be considered to be nearly equal to R1H, and R3L can be considered to be nearly equal to R3H. Thus two states caused by the resistance change due to the magnetoresistance effect through the intermediate layer S2 can be detected. Here, R3L is a resistance of the magnetoresistance effect element MR3 at its lower resistance state, and R3H is a resistance of the magnetoresistance effect element MR3 at its higher resistance state.

A typical example is configured by forming the intermediate layer S2 from an insulating layer, and the intermediate layers S1 and S3 from metal. The element of this embodiment only needs to distinguish two states. Advantageously, this facilitates providing a wider margin than in the multivalued memory element, and the manufacturing cost can be reduced by decreasing the number of insulating layers.

Next, the constituent materials of each layer of the magnetic memory element R are described.

The ferromagnetic layers FP1, FP2, FF1, and FF2 can be made of various magnetic materials such as Co, Fe, Ni, or alloys containing them. When these materials are used, the easy magnetization axis takes an in-plane direction. In the magnetic memory element R of this embodiment, a different magnetic material may be used for each layer.

As another example, it is possible to use materials having a high uniaxial anisotropy constant Ku and exhibiting perpendicular magnetic anisotropy such as FePt, CoPt, FePd, and CoPd. It is also possible to use magnetic materials with the crystal structure being the hcp structure (hexagonal closest packed structure) and exhibiting perpendicular magnetic anisotropy. A typical example thereof is a magnetic material containing metal composed primarily of Co, but other metals having the hcp structure can also be used. It is also possible to use alloys of rare earth elements and iron-group transition elements exhibiting perpendicular magnetic anisotropy such as GdFe, GdCo, GdFeCo, TbFe, TbCo, TbFeCo, GdTbFe, GdTbCo, DyFe, DyCo, and DyFeCo.

When the pinned layer has a laminated structure, the constituent ferromagnetic sublayers can be made of Co, and the nonmagnetic sublayers can be made of Pt or Pd.

Preferably, the pinned layer is made of materials having high spin polarization because it increases the efficiency of magnetization inversion by spin transfer, thereby increasing the effect of switching current reduction and decreasing the current threshold. Hence the high spin polarization material called "half metal" is one of the ideal materials. Examples of half metals include Heusler alloys, rutile oxides, spinel oxides, perovskite oxides, double perovskite oxides, chromium compounds with zincblende structure, manganese compounds with pyrite structure, and sendust alloys.

These magnetic substances used for the pinned layers and the memory layers can be doped with nonmagnetic elements such as Ag, Cu, Au, Al, Mg, Si, Bi, Ta, B, C, O, N, Pd, Pt, Zr, Ir, W, Mo, Nb, and H to adjust magnetic characteristics and various other material properties including crystallinity and mechanical and chemical characteristics. When the pinned layers and/or the memory layers have a multilayer structure, the constituent nonmagnetic sublayers can be made of Cu, Au, Ag, Ru, Ir, or Os or alloys containing one or more thereof.

The thickness of the pinned layer is preferably in the range of 0.6 to 100 nm. The thickness of the memory layer is preferably in the range of 0.2 to 50 nm.

The antiferromagnetic layers AF1 and AF2 are preferably made of Fe—Mn, Pt—Mn, Pt—Cr—Mn, Ni—Mn, Pd—Mn, Pd—Pt—Mn, Ir—Mn, Pt—Ir—Mn, NiO, $Fe_2O_3$, or magnetic semiconductors.

When the intermediate layers S1, S2, and S3 are made of nonmagnetic metal, they can be made of any one of Au, Cu, Cr, Zn, Ga, Nb, Mo, Ru, Pd, Ag, Hf, Ta, W, Pt, and Bi, or alloys containing one or more thereof. The thickness of the intermediate layer made of such nonmagnetic metal is preferably in the range of 0.2 to 20 nm.

To increase the magnetoresistance effect of the magnetic memory element of this embodiment, it is effective to allow the material of the intermediate layer S2 to function as a tunnel barrier layer. In this case, the intermediate layer S2 can be made of $Al_2O_3$, $SiO_2$, MgO, AlN, $Bi_2O_3$, $MgF_2$, $CaF_2$, $SrTiO_2$, $AlLaO_3$, Al—N—O, Si—N—O, or nonmagnetic semiconductors (ZnO, InMn, GaN, GaAs, $TiO_2$, Zn, Te, or any one thereof doped with transition metals). These compounds do not need to have exactly stoichiometric compositions, but may have excess or deficiency of oxygen, nitrogen, or fluorine. The thickness of the intermediate layer S2 made of such insulating material is preferably in the range of 0.2 to 5 nm.

When the intermediate layer 52 is an insulating layer, it may include pinholes running through the thickness. In this case, the pinhole is filled with the material of at least one of the memory layer FF1 and the memory layer FF2 located on both sides. When the memory layer FF1 is connected with the memory layer FF2 through pinholes, the "BMR effect (ballistic magnetoresistance effect)" due to the so-called "magnetic point contact" is produced. This results in an extremely great magnetoresistance effect and increases the margin at the time of the match detection operation. A preferable aperture diameter of the pinhole is generally 20 nm or less. The pinhole can be shaped like a circular cone, circular cylinder, sphere, polygonal cone, polygonal cylinder, or various other configurations. The number of pinholes may be one or more than one.

Next, a working example of this embodiment is described.

The material and thickness of each layer constituting a magnetic memory element (sample 1) of this working example are as follows:

Sample 1: Upper electrode EL1 (Cu)/Antiferromagnetic layer AF1 (PtMn: 20 nm)/First pinned layer FP1 (Co: 12 nm)/Intermediate layer S1 (Cu: 6 nm)/First memory layer FF1 (FeNi: 2.5 nm)/Intermediate layer S2 (MgO: 0.85 nm)/Second memory layer FF2 (CoFeNi: 3 nm)/Intermediate layer S3 (Cu: 7 nm)/Second pinned layer FP2 (CoFe: 10 nm/Ru: 1 nm/CoFe: 10 nm)/Antiferromagnetic layer AF2 (IrMn: 18 nm)/Lower electrode EL2 (Cu)

This magnetic memory element was fabricated by the following process.

First, a lower electrode EL2 was formed above a wafer. Next, an ultrahigh vacuum sputtering apparatus was used to form a laminated structure composed of an antiferromagnetic layer AF2, a second pinned layer FP2, an intermediate layer S3, a second memory layer FF2, an intermediate layer S2, a first memory layer FF1, an intermediate layer S1, a first pinned layer FP1, and an antiferromagnetic layer AF1, and to form a protective film thereon. The wafer was annealed in a vacuum furnace in magnetic field at 270° C. for 10 hours to provide the first pinned layer FP1 and the second pinned layer FP2 with unidirectional anisotropy.

Next, the protective film was coated with a resist and EB (electron beam) exposed to form a mask adapted to the shape of the magnetic memory element. Then the region not covered with the mask was etched by ion milling. The processed size was 100 nm×50 nm. After the etching, the mask was removed, and $SiO_2$ film was successively deposited between the cells by ultrahigh vacuum sputtering. Then the surface was smoothed by ion milling to expose the surface of the protective film (surfacing process). An upper electrode EL1 was formed on the surface of this protective film. By the method described above, the magnetic memory element of this working example was completed.

Second Embodiment

Next, a second embodiment of the invention is described.

Figure 6:
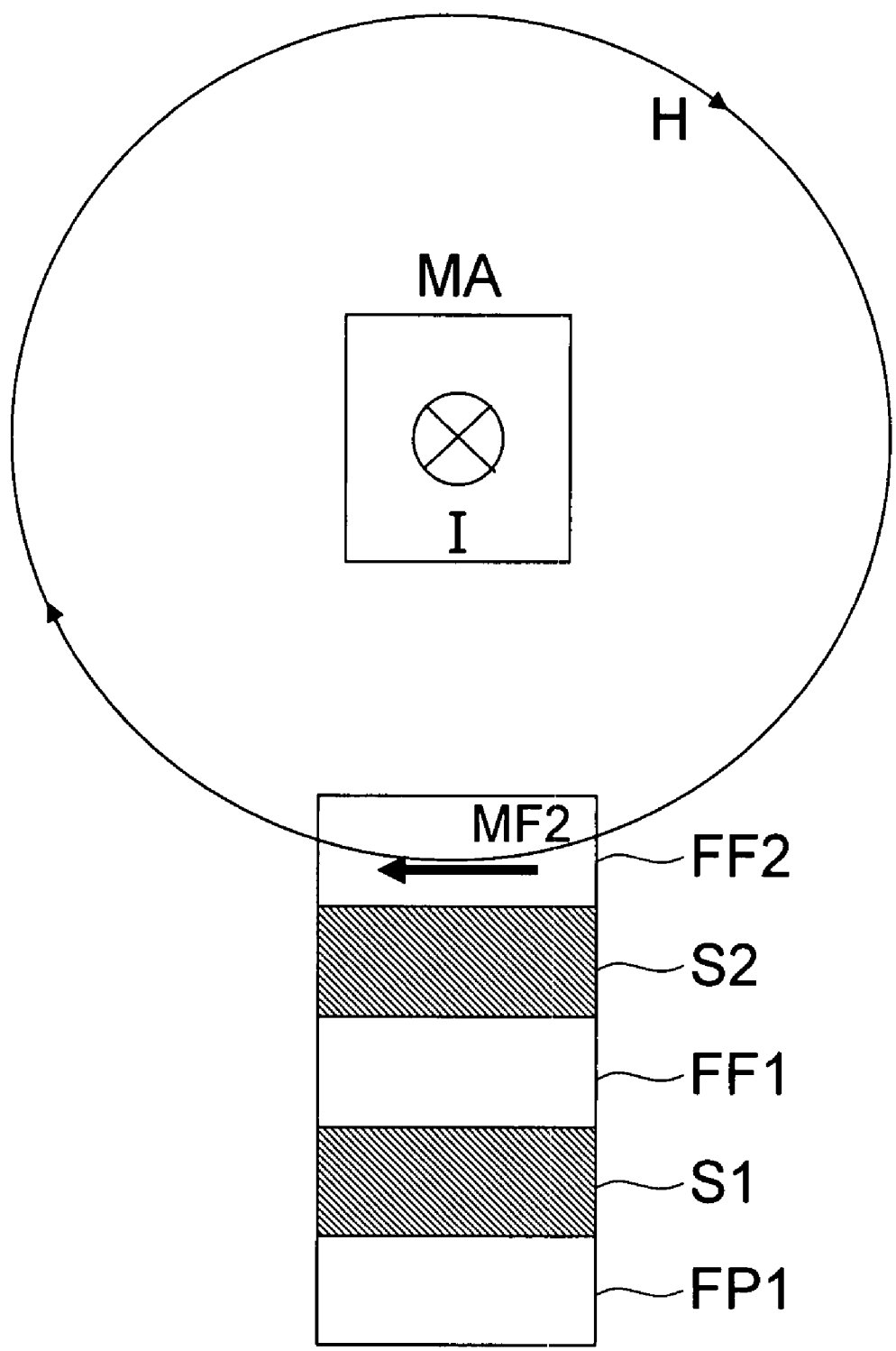
FIGS. 6 to 8 are schematic views showing a magnetic memory element according to a second embodiment of the invention.
Figure 7:
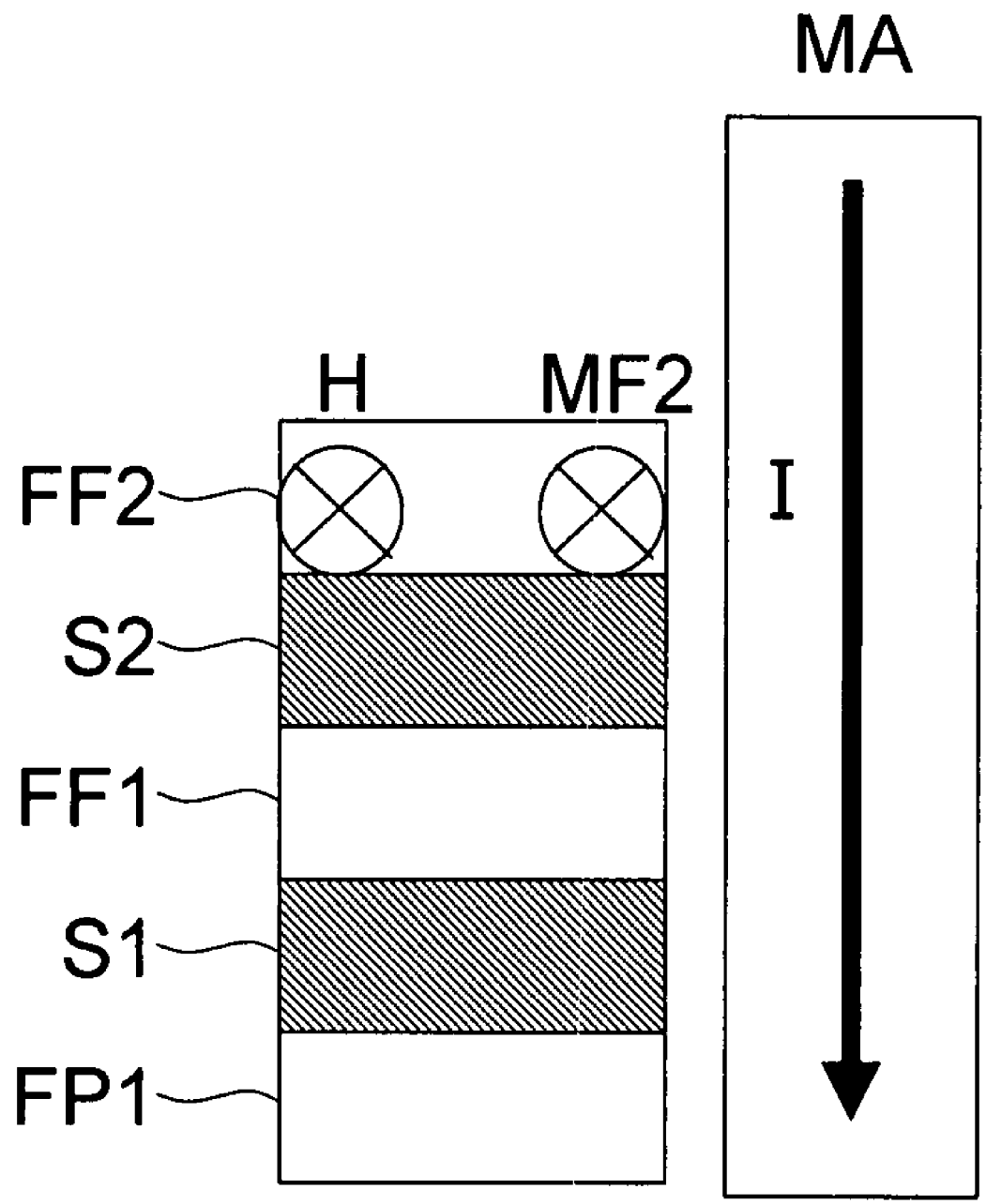
Figure 8:
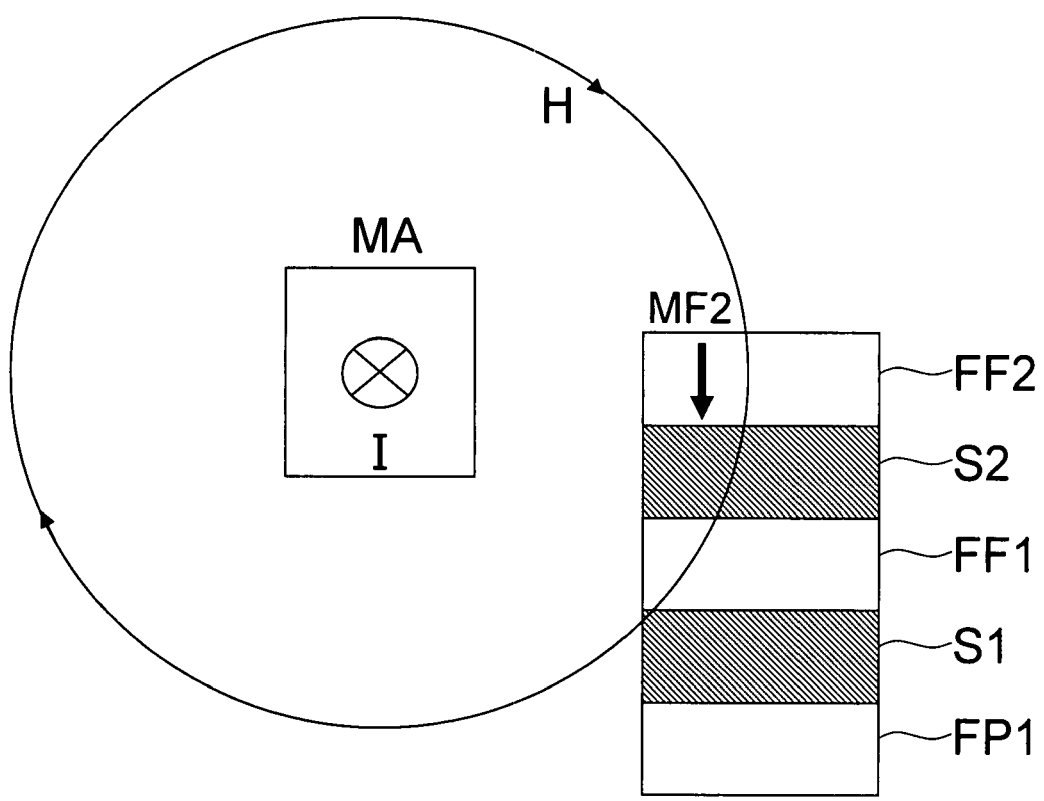

FIGS. 6 to 8 are schematic views showing a magnetic memory element according to the second embodiment of the invention.

The magnetic memory element R of this embodiment does not need the third intermediate layer and the second pinned layer among the components of the magnetic memory element R of the first embodiment. Instead, the present embodiment includes a magnetic field application section MA for applying magnetic field to the second memory layer FF2. The magnetic field application section MA is typically realized by a conductor portion capable of passing a current. The magnitude of current magnetic field is proportional to the magnitude of the current, and depends on the direction of the current flow. In the example shown in FIG. 6, the magnetic field application section MA made of conductor is placed above the magnetic memory element. In the examples shown in FIGS. 7 and 8, the magnetic field application section MA is placed laterally. However, this embodiment is not limited to these examples, but encompasses any other arrangements that allow the magnetic field application section MA to exert magnetic field on the second memory layer FF2.

On the other hand, this embodiment also requires that the first memory layer FF1 not be inversed by magnetic field upon writing to the second memory layer FF2. Hence, preferably, the magnetic field application section MA is placed nearer to the second memory layer FF2 than to the first memory layer FF1. In an arrangement where a large magnetic field is applied to the second memory layer FF2 and a small magnetic field is applied to the first memory layer FF1, the first memory layer FF1 may have a smaller coercivity than the second memory layer FF2. The method for writing to the first memory layer FF1 and the match detection method for the first memory layer FF1 and the second memory layer FF2 in this embodiment are the same as those described above with reference to the first embodiment. That is, they are performed by connecting the first pinned layer FP1 and the second memory layer FF2 to the first electrode and the second electrode (not shown), respectively, and passing a current between the first electrode and the second electrode.

Writing to the second memory layer FF2 is performed by passing a current I through the magnetic field application section MA to apply a current magnetic field H. Hence the direction of the easy magnetization axis of the second memory layer FF2 is preferably parallel or antiparallel to the direction of the applied current magnetic field H. The magnitude of the passed current I has an upper limit such that the magnitude of the current magnetic field acting on the first memory layer FF1 does not exceed the coercivity of the first memory layer FF1. Hence, preferably, the first memory layer FF1 is made of a magnetic material having a relatively larger coercivity than that of the second memory layer FF2 because the magnetic field application section MA can be placed more flexibly. Writing to the first memory layer FF1 is performed by the action of spin transfer torque described above with reference to the first embodiment. Hence a certain level of coercivity does not interfere with writing to the first memory layer FF1. Furthermore, also in this embodiment, writing to the second memory layer FF2 can be performed simultaneously with the match detection operation for the first memory layer FF1 and the second memory layer FF2.

As described above with reference to FIG. 4, the match detection operation uses the magnetoresistance effect between the first memory layer FF1 and the second memory layer FF2. Hence the electric resistance in the direction between the electrodes EL1 and EL2 is preferably larger in the nonmagnetic layer S2 than in the nonmagnetic layer S1 so that the magnetoresistance effect through the nonmagnetic layer S2 is greater than the magnetoresistance effect through the nonmagnetic layer S1 when a current is passed between the electrodes EL1 and EL2. To this end, the nonmagnetic body S2 can be made of insulator, and the nonmagnetic body S1 can be made of metal or semiconductor, or insulator having a higher conductivity than the nonmagnetic body S2.

According to this embodiment, the magnetic field application section MA is not necessarily needed for each magnetic memory element. More specifically, as described later in detail, the magnetic memory elements R are arranged in a matrix configuration, for example, to form a magnetic memory. Here, the magnetic field application section MA can be shared among a plurality of magnetic memory elements as long as an effective magnetic field can be applied to the memory layer FF2 of the plurality of magnetic memory elements. That is, the configuration of the memory can be simplified by sharing the magnetic field application section MA used for writing.

In contrast to the first embodiment, writing to the second memory layer FF2 is performed using magnetic field. Hence there is no need to adjust the magnitude of write current threshold for spin transfer between the first memory layer FF1 and the second memory layer FF2. This broadens the options of materials and facilitates more reliable and stable operation.

Furthermore, in this embodiment, writing and match detection for the second memory layer FF2 are independent operations. Hence, even if the match detection is adapted to only one current polarity, the writing and match detection for the second memory layer FF2 can be simultaneously performed.

Furthermore, the first embodiment can be combined with the second embodiment. More specifically, the magnetic memory element R having a laminated structure described above with reference to the first embodiment can be combined with the magnetic field application section MA in the second embodiment to pass a spin-polarized current along with application of magnetic field from the magnetic field application section MA in writing to the second memory layer FF2. Then, because of the assistance of magnetic field from the magnetic field application section MA, writing to the second memory layer FF2 can be performed with a smaller spin-polarized current. As a result, the difference of write current thresholds between the first memory layer FF1 and the second memory layer FF2 can be increased, and false writing to the first memory layer FF1 can be prevented more reliably.

Third Embodiment

Next, a third embodiment of the invention is described.

Figure 9:
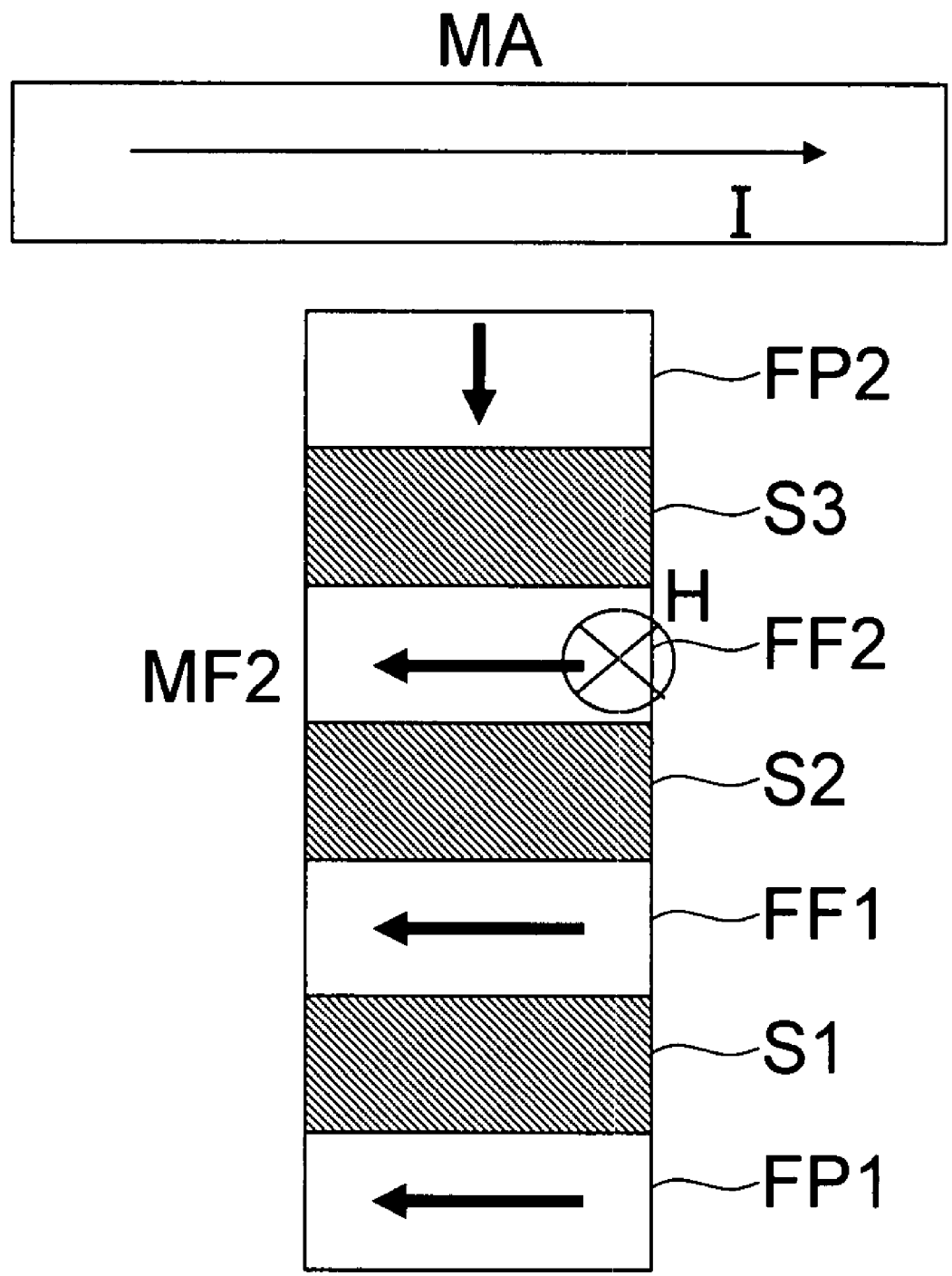
FIGS. 9 to 11 are schematic views showing a magnetic memory element according to a third embodiment of the invention.
Figure 10:
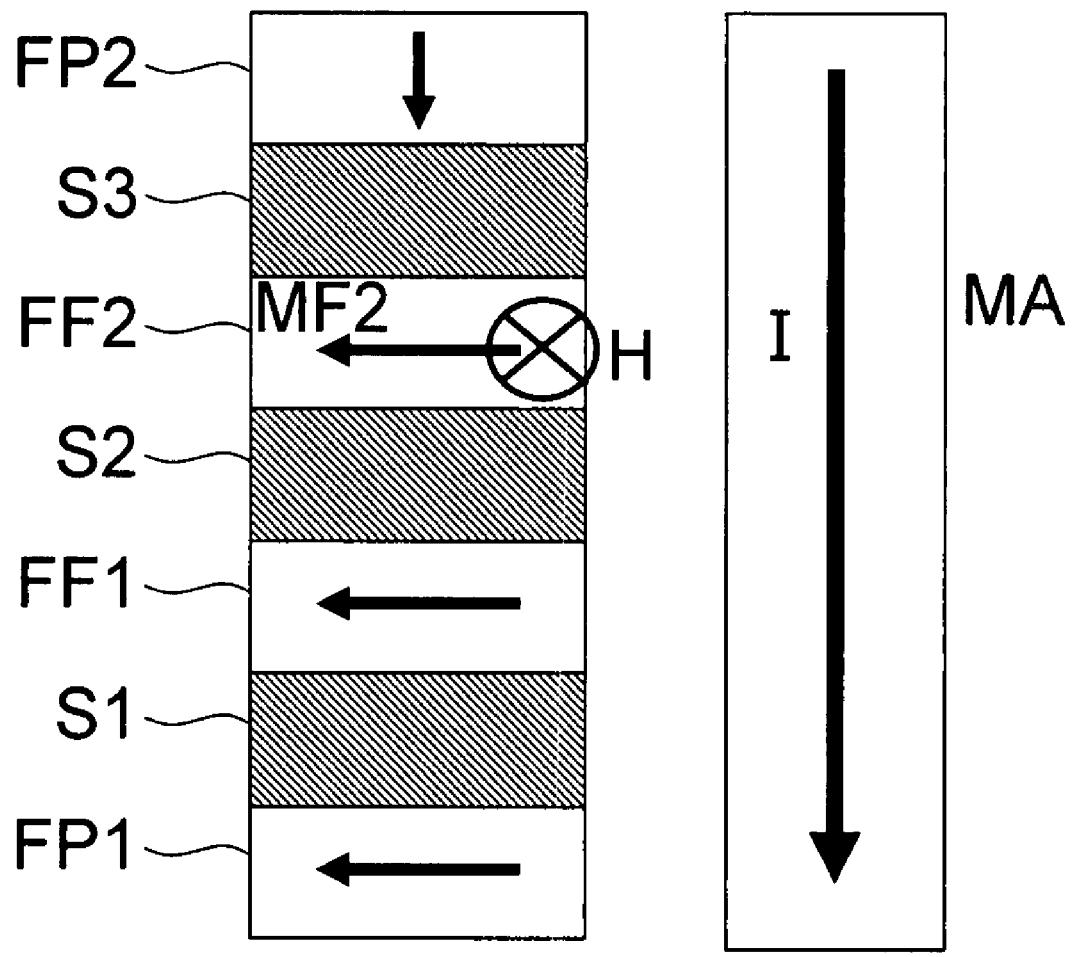
Figure 11:
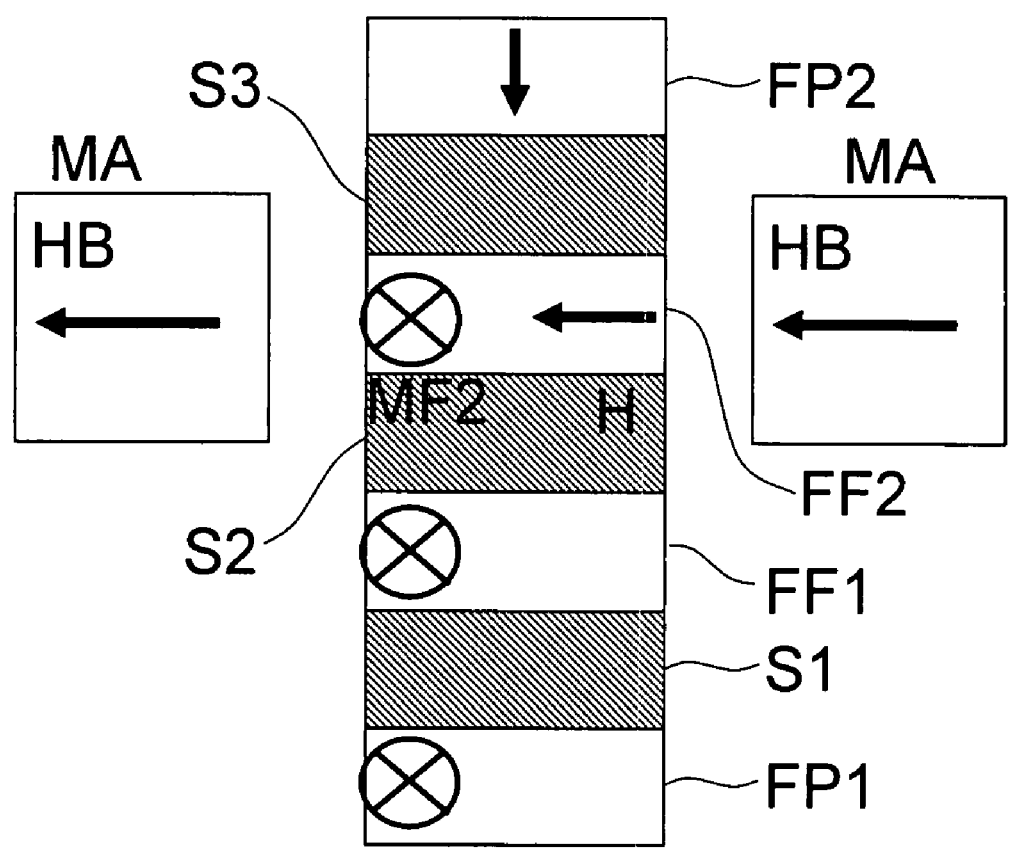

FIGS. 9 to 11 are schematic views showing a magnetic memory element according to the third embodiment of the invention.

This embodiment includes a magnetic memory element having the same laminated structure as that of the magnetic memory element described above with reference to the first embodiment and a magnetic field application section MA described above with reference to the second embodiment. However, certain conditions are imposed on the easy magnetization axis. That is, the pinned layer FP2 has a perpendicular magnetization, and the pinned layer FP1 and the memory layers FF1 and FF2 have in-plane magnetizations. Under the action of the magnetic field application section MA, the magnetic field applied to the memory layer FF2 is directed along the in-plane difficult axis of the memory layer FF2, in contrast to the second embodiment. The magnitude of the applied magnetic field H needs to be smaller than the anisotropy magnetic field. The magnetic field application section MA can be a conductor generating a current magnetic field H, or can be a hard bias layer based on a permanent magnet as illustrated in FIG. 11. The method for writing to the first memory layer FF1 and for comparing between the first memory layer FF1 and the second memory layer FF2 in this embodiment can be the same as those described above with reference to the first embodiment. Writing to the second memory layer FF2 is performed by simultaneous action of spin transfer and applied magnetic field. By this method, writing to the second memory layer FF2 can be performed with a smaller current than in the first embodiment.

Hence the difference of Ic3 and Ic4 from Ic1 and Ic2 can be increased, and false writing to the first memory layer FF1 at the time of writing to the second memory layer FF2 can be prevented more reliably.

In this embodiment, with the magnitude of current and applied magnetic field left unchanged, if only either one of the direction of the current flow and the direction of the applied magnetic field is reversed, the magnetization direction of the second memory layer FF2 is inverted. If both are reversed, the magnetization direction of the second memory layer FF2 is not inverted. That is, there are two possible methods for writing two different states to the second memory layer FF2: (1) inverting the direction of current flow, and (2) inverting the direction of applied magnetic field.

When a permanent magnet is used for the magnetic field application section MA, the method of (1) inverting current is convenient. In the method of (1) inverting current, the timing of writing and match detection for the second memory layer FF2 is the same as that described above with reference to the first embodiment. On the other hand, in the method of (2) inverting magnetic field, the timing of writing and match detection for the second memory layer FF2 can be the same as that described above with reference to the second embodiment.

Also in this embodiment, the electric resistance in the direction between the electrodes EL1 and EL2 is preferably larger in the nonmagnetic layer S2 than in the nonmagnetic layer S1 and the nonmagnetic layer 53 so that the magnetoresistance effect through the nonmagnetic layer S2 is greater than the magnetoresistance effect through the nonmagnetic layer S1 and than the magnetoresistance effect through the nonmagnetic layer S3 when a current is passed between the electrodes EL1 and EL2. To this end, the nonmagnetic body S2 can be made of insulator, and the nonmagnetic bodies S1 and S3 can be made of metal or semiconductor, or insulator having a higher conductivity than the nonmagnetic body S2.

Fourth Embodiment

Next, a fourth embodiment of the invention is described.

Figure 12:
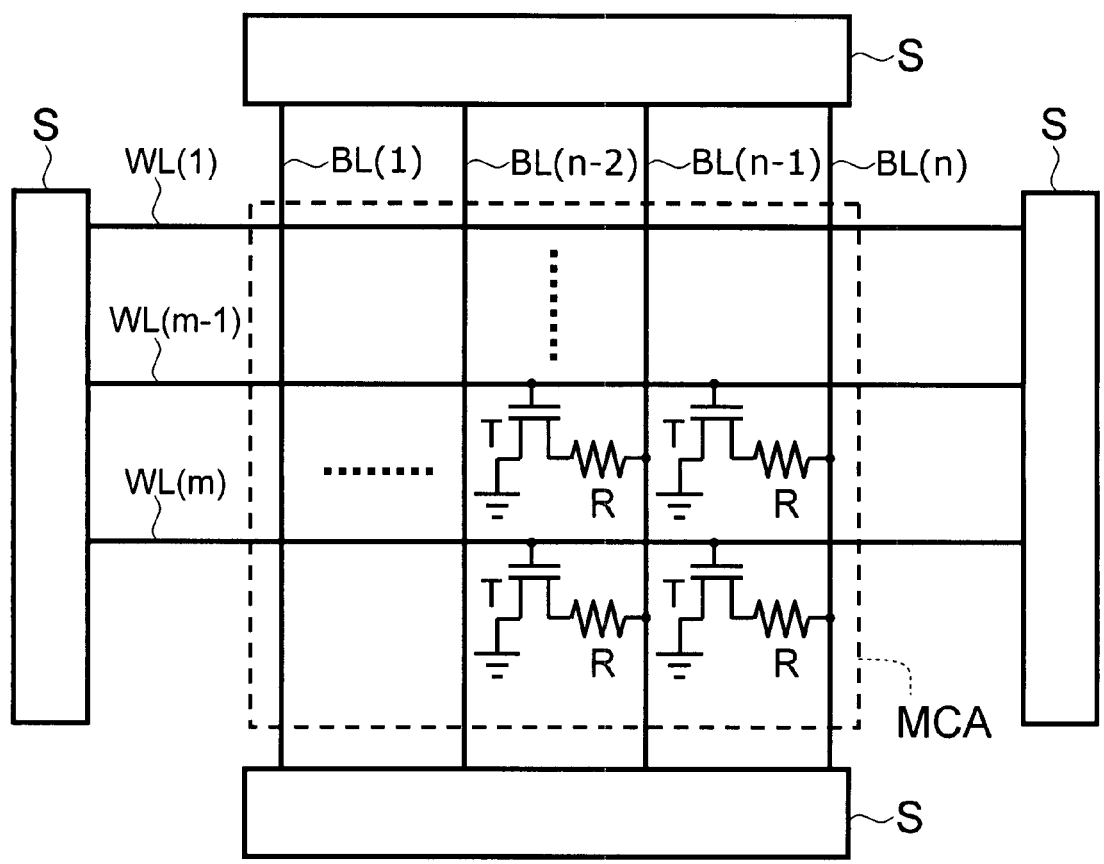
FIG. 12 is a schematic view showing a magnetic memory apparatus according to a fourth embodiment of the invention.

FIG. 12 is a schematic view showing a magnetic memory apparatus according to this embodiment.

A magnetic memory apparatus can be configured by arranging the magnetic memory elements described above with reference to the first embodiment or the magnetic memory elements each using a permanent magnet as the magnetic field application section MA described in the third embodiment. In the magnetic memory apparatus of the present embodiment, a plurality of interconnects WL generally referred to as "word lines" are arranged in parallel to each other, and in a direction intersecting therewith, a plurality of interconnects BL generally referred to as "bit lines" are arranged in parallel to each other. One memory cell MC(i,j) is connected between the i-th word line and the j-th bit line. Each memory cell includes a transistor T and one of the magnetic memory elements R described above with reference to the first to third embodiment. A surrounding circuit S including a decoder for selecting the interconnects and a read circuit is provided outside the memory cell array MCA and connected to the interconnects.

Figure 13:
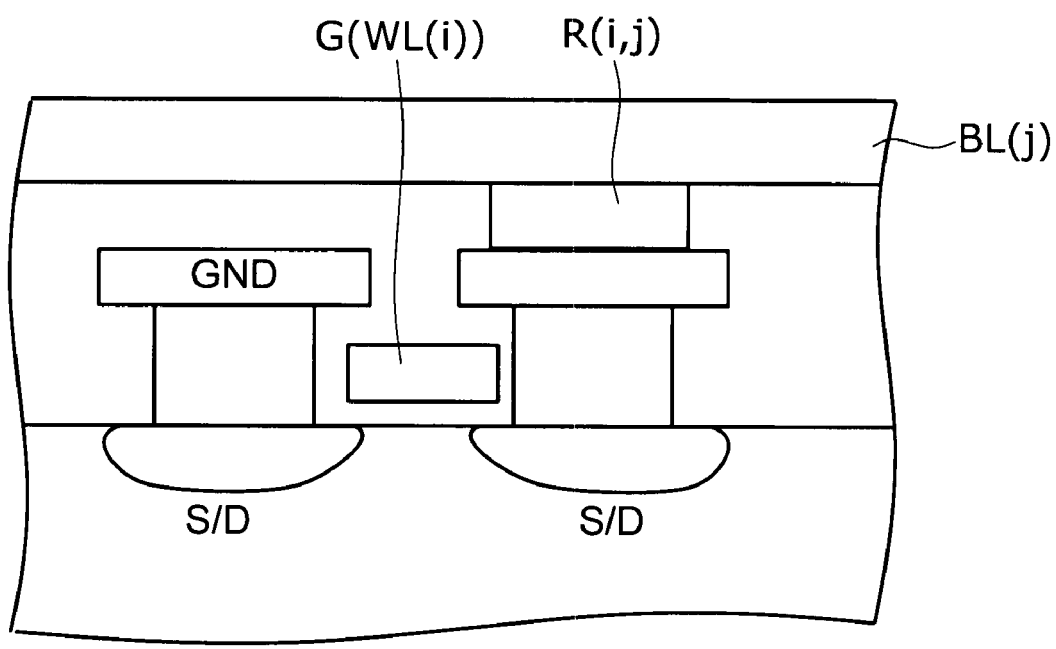
FIG. 13 is a schematic view of the cross-sectional structure of a memory cell, the word line WL(i) and the bit line BL(j).

FIG. 13 is a schematic view of the cross-sectional structure of each memory cell and the word line WL(i) and the bit line BL(j) connected thereto.

The word line WL(i) is connected to the gate of the transistor T. One end of the current path of the transistor T is connected to a ground terminal or power supply terminal, and the other end is connected to the magnetic memory element R. The memory cells are electrically insulated from each other by an insulating film I.

Figure 14:
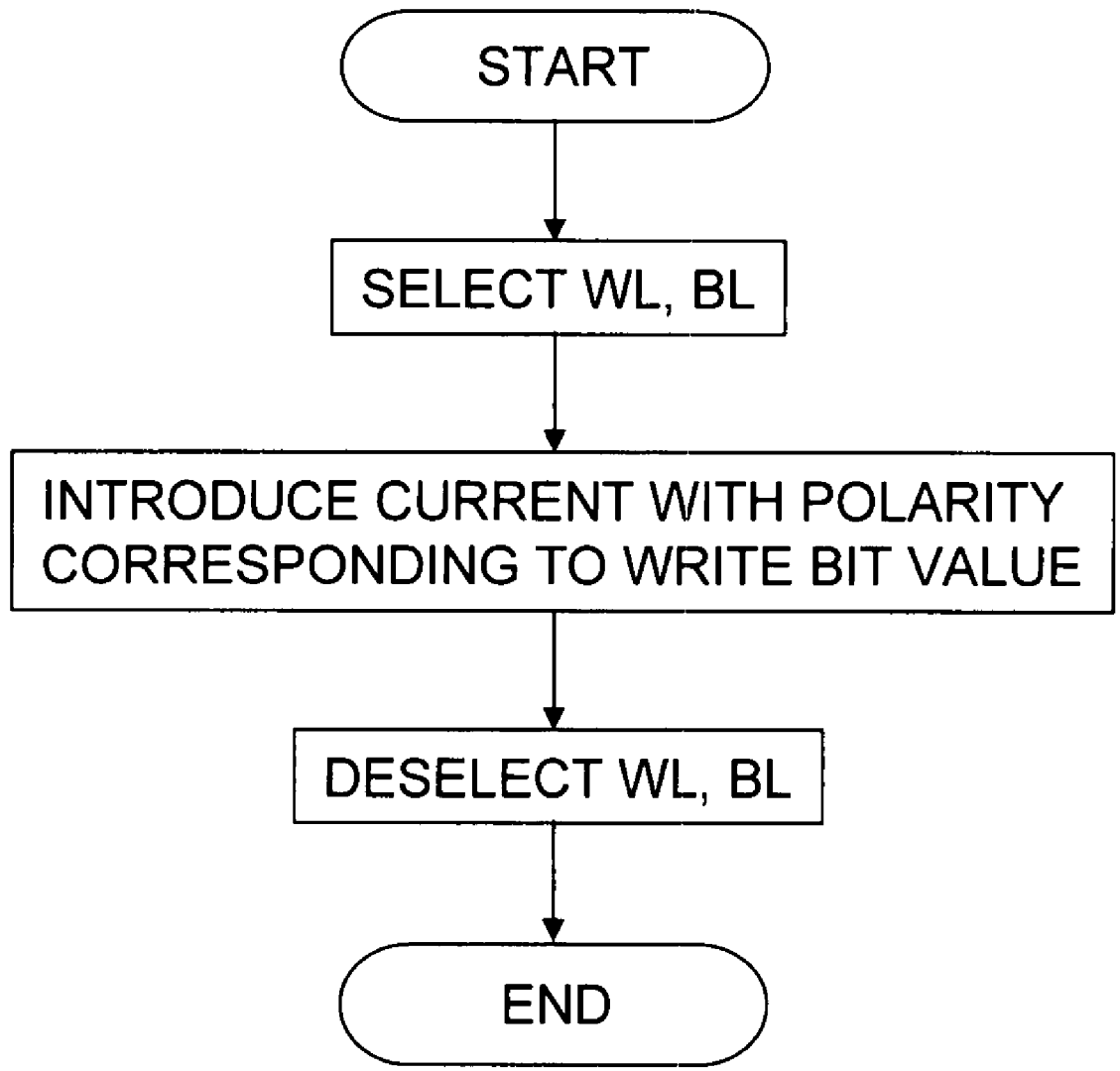
FIG. 14 is a flow chart showing the write operation to the first memory layer of the magnetic memory element R.

FIG. 14 is a flow chart showing the write operation to the first memory layer of the magnetic memory element R.

Writing to the memory layers of the magnetic memory element R(i,j) begins by selecting the interconnect WL(i) having an address corresponding to the external address signal to turn on the transistor T. Next, writing is performed by passing a current Iw through BL(j). Then WL(i) and BL(j) are deselected. The conditions imposed on the sign and magnitude of the current Iw are as described above with reference to the first and third embodiment.

Figure 15:
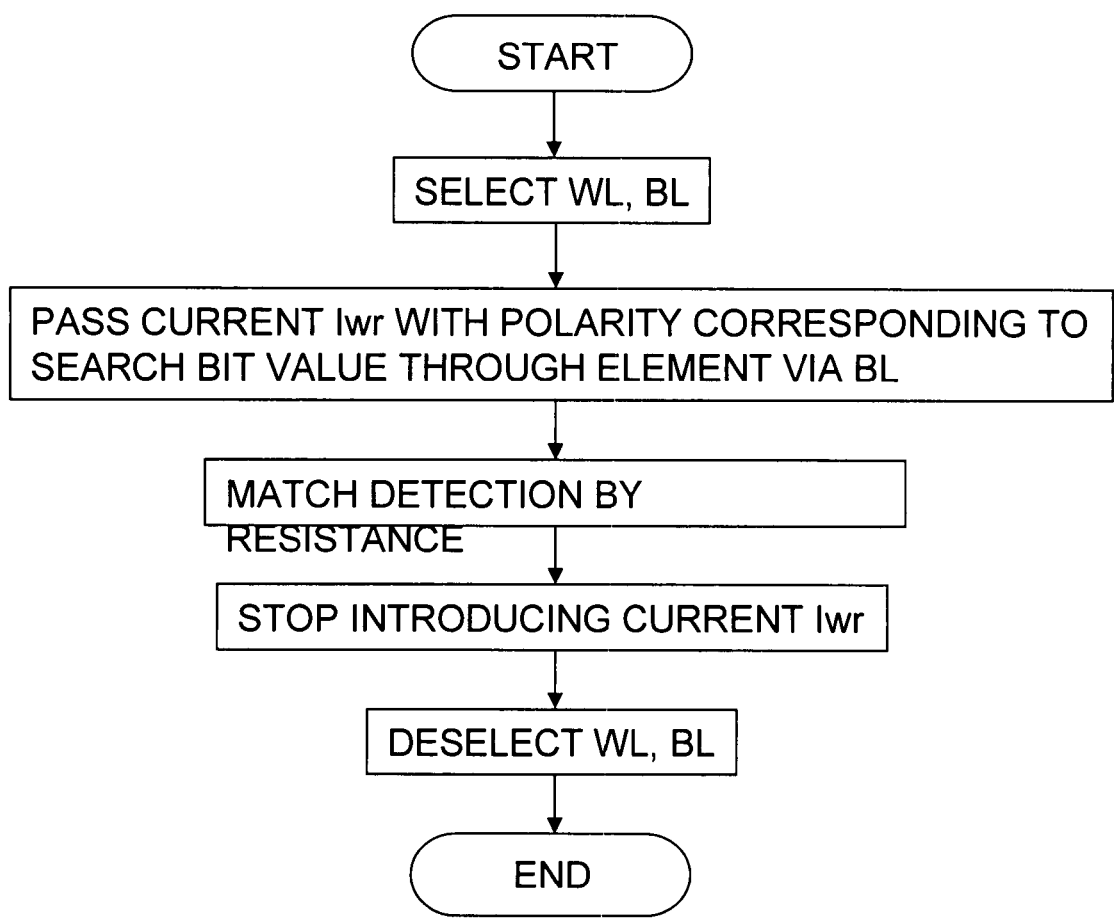
FIG. 15 is a flow chart showing the match detection operation in the case where the surrounding circuit S is a bipolar circuit.

FIG. 15 is a flow chart showing the match detection operation in the case where the surrounding circuit S is a bipolar circuit.

In this case, writing and match detection for the second memory layer FF2 can be performed simultaneously. More specifically, match detection for the magnetic memory element R(i,j) between the data stored in the first memory layer FF1 and the data stored in the second memory layer FF2 is performed by first selecting the word line and then passing a current Iwr, as with the writing operation. The condition on the magnitude of Iwr is as described above with reference to the first and third embodiment. By passing the current Iwr, the data to be searched for is written to the second memory layer FF2. Then the current Iwr is directly used as a sense current to measure resistance for detecting match/mismatch of data between the first memory layer FF1 and the second memory layer FF2 by the magnetoresistance effect. Subsequently, the current Iwr is stopped, and the word line WL and the bit line BL are deselected.

Figure 16:
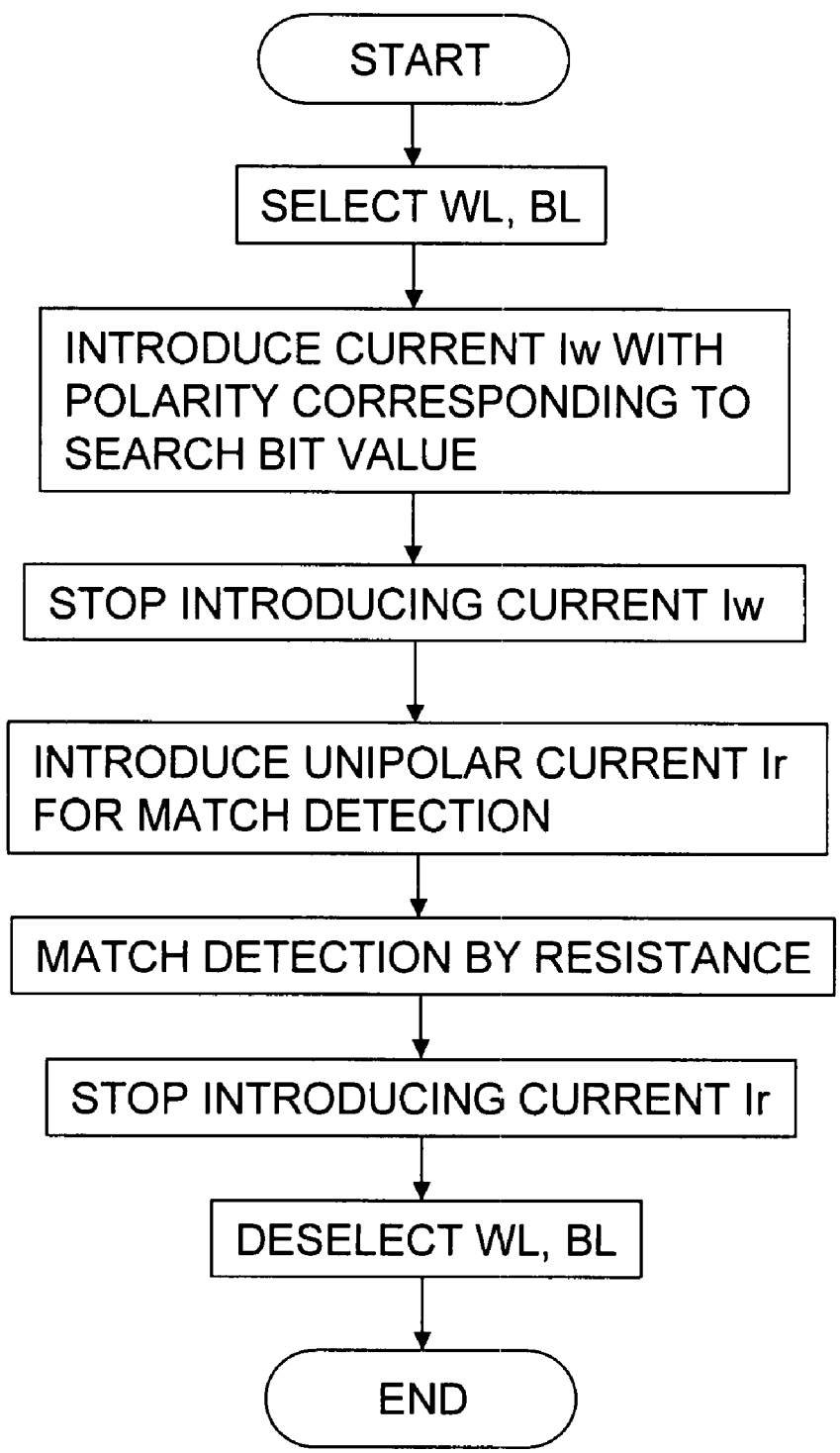
FIG. 16 is a flow chart showing the match detection operation in the case where the surrounding circuit S is a unipolar circuit.

FIG. 16 is a flow chart showing the match detection operation in the case where the surrounding circuit S is a unipolar circuit.

In this case, writing and match detection for the second memory layer FF2 are performed separately. More specifically, writing data to the second memory layer FF2 of the magnetic memory element R(i,j) begins by selecting the word line and passing a current Iw corresponding to the value of a search bit. Then the current Iw is stopped, and subsequently a unipolar current Ir for match detection is passed. Then the resistance is measured for detecting match/mismatch of data between the first memory layer FF1 and the second memory layer FF2 by the magnetoresistance effect. Subsequently, the current Ir is stopped, and the word line WL and the bit line BL are deselected.

Figure 17:
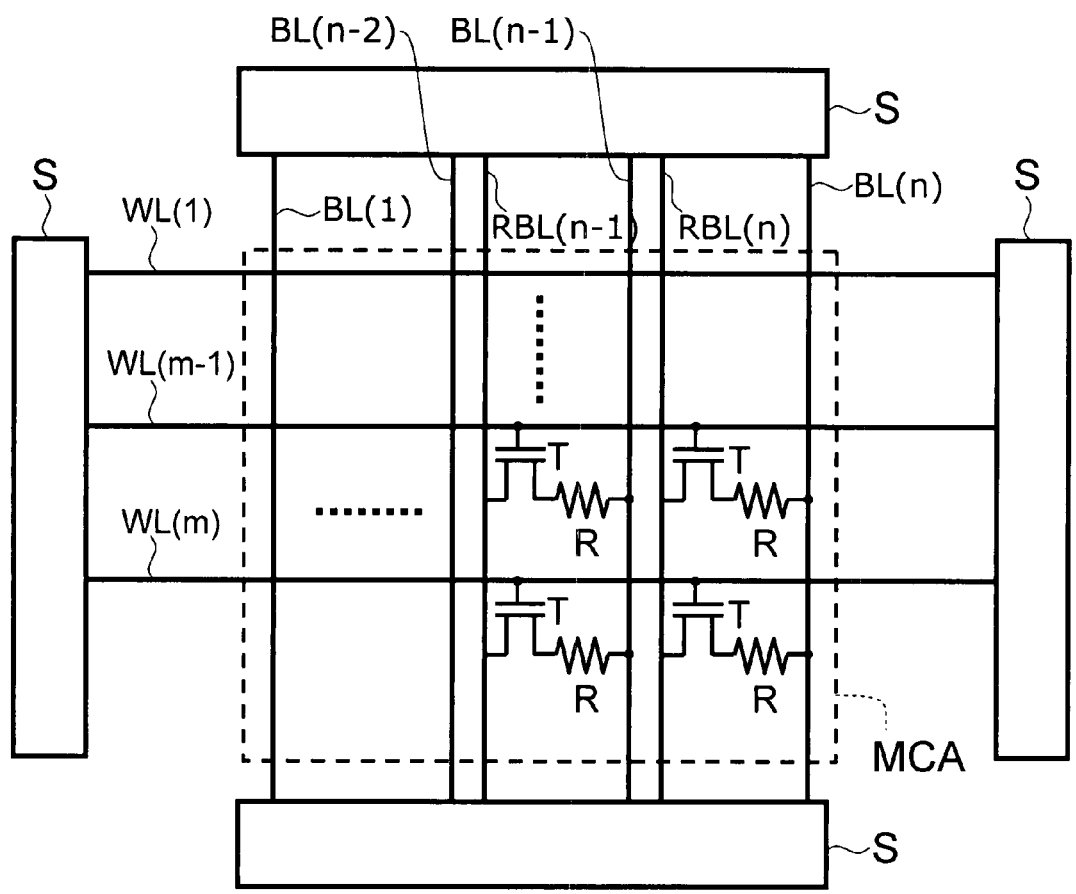
FIG. 17 is a schematic view showing a variation of the magnetic memory apparatus of the fourth embodiment.

FIG. 17 is a schematic view showing a variation of the magnetic memory apparatus of this embodiment.

In this variation, one of the main electrodes of the transistor T is not directly connected to the ground terminal or power supply terminal, but is connected to the read bit line RBL, which is connected to the ground terminal or power supply terminal through the surrounding circuit S. This facilitates controlling the current passed through the magnetic memory element R via the transistor T.

Figure 18:
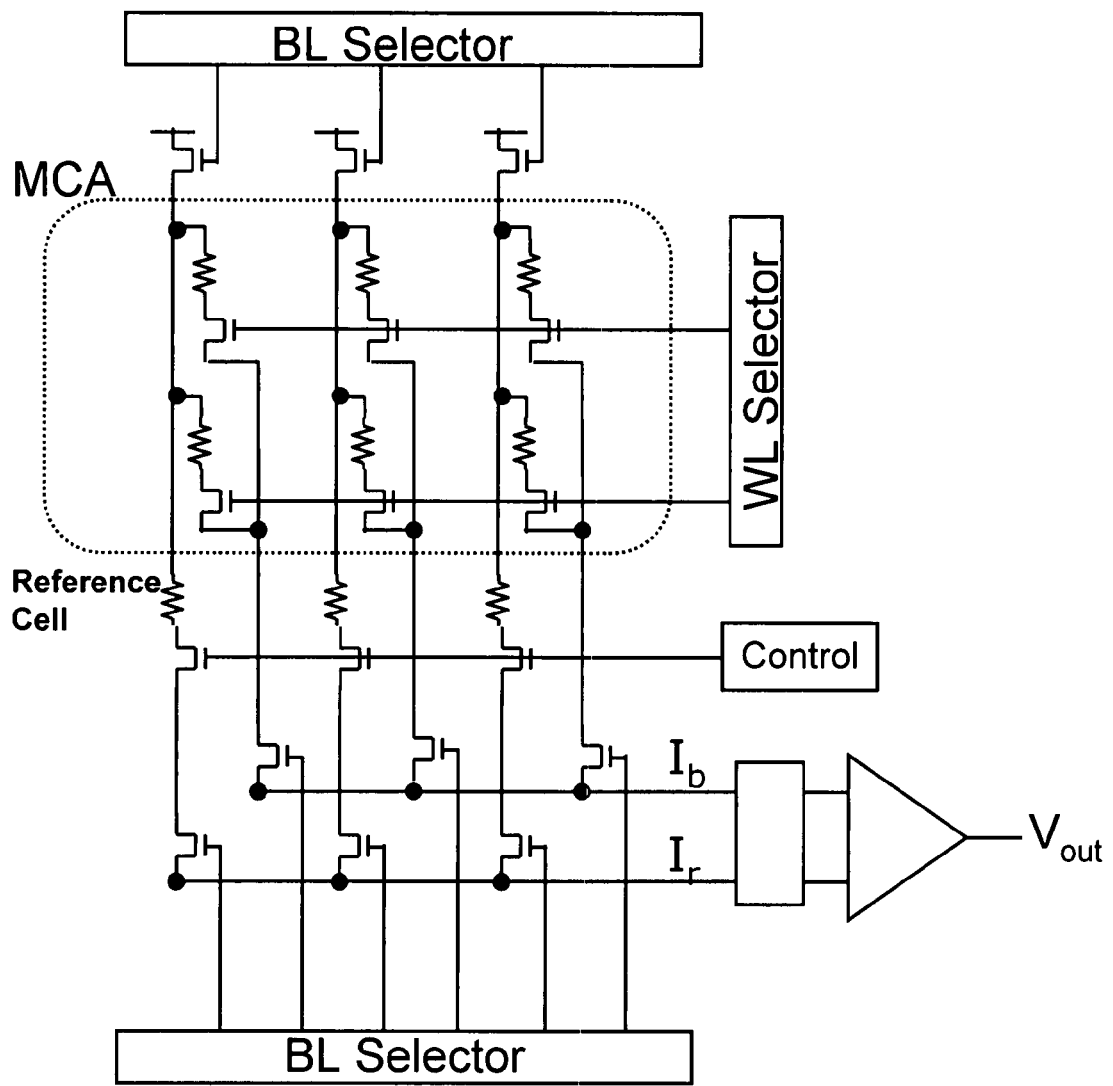
FIG. 18 is a schematic view showing a working example of the variation shown in FIG. 17.

FIG. 18 is a schematic view showing a working example of the variation shown in FIG. 17.

In this working example, the bit line BL is connected to a reference cell RC having the same configuration as the magnetic memory element R in the memory cell array and to a transistor T, and the read bit line RBL is connected to a transistor T. The transistors T are connected to a comparison circuit CO for comparing their current or voltage. According to this configuration, comparison with the reference cell RC can be performed reliably and easily, and reading can be performed rapidly and accurately.

Fifth Embodiment

Next, a fifth embodiment of the invention is described.

Figure 19:
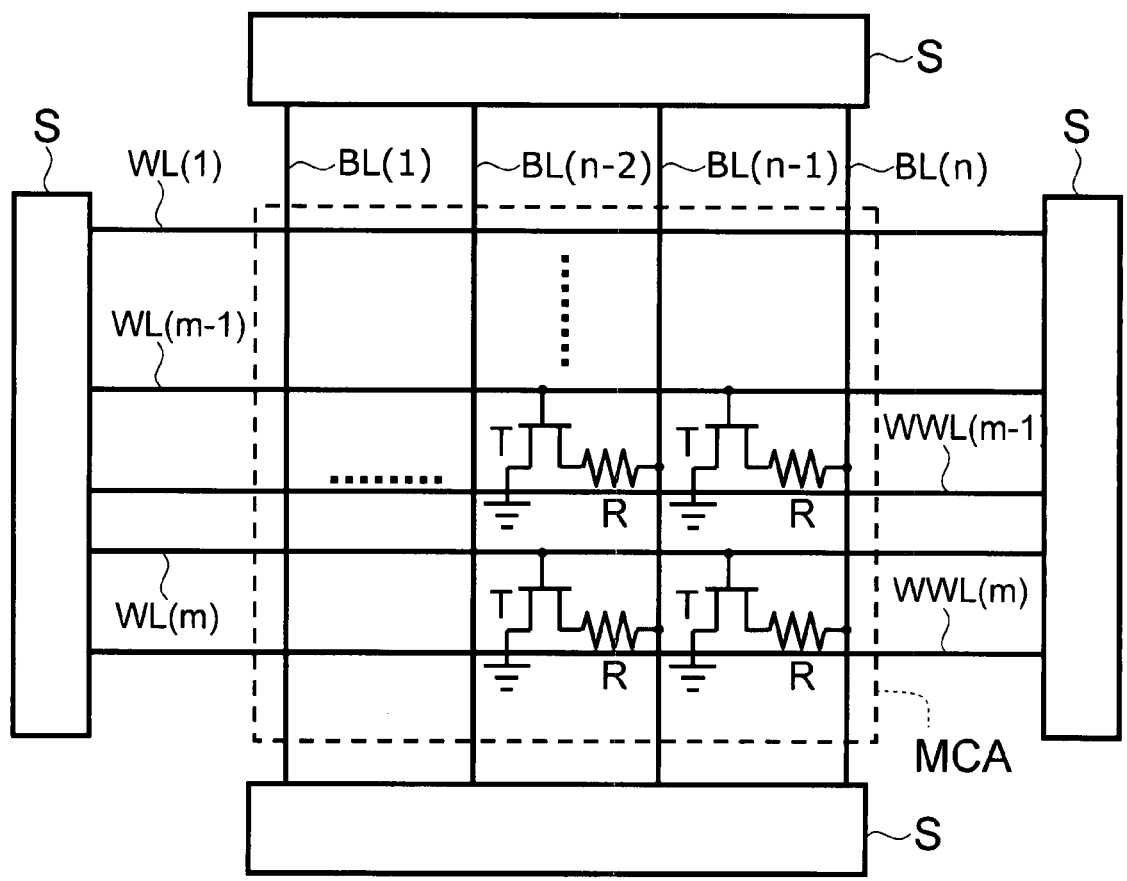
FIG. 19 is a schematic view showing a magnetic memory apparatus according to a fifth embodiment.

FIG. 19 is a schematic view showing a magnetic memory apparatus according to this embodiment.

In addition to the magnetic memory element R and the word line WL(i) and bit line BL(j) connected thereto, this embodiment includes a write word line WWL(i) near the magnetic memory element R.

Figure 20:
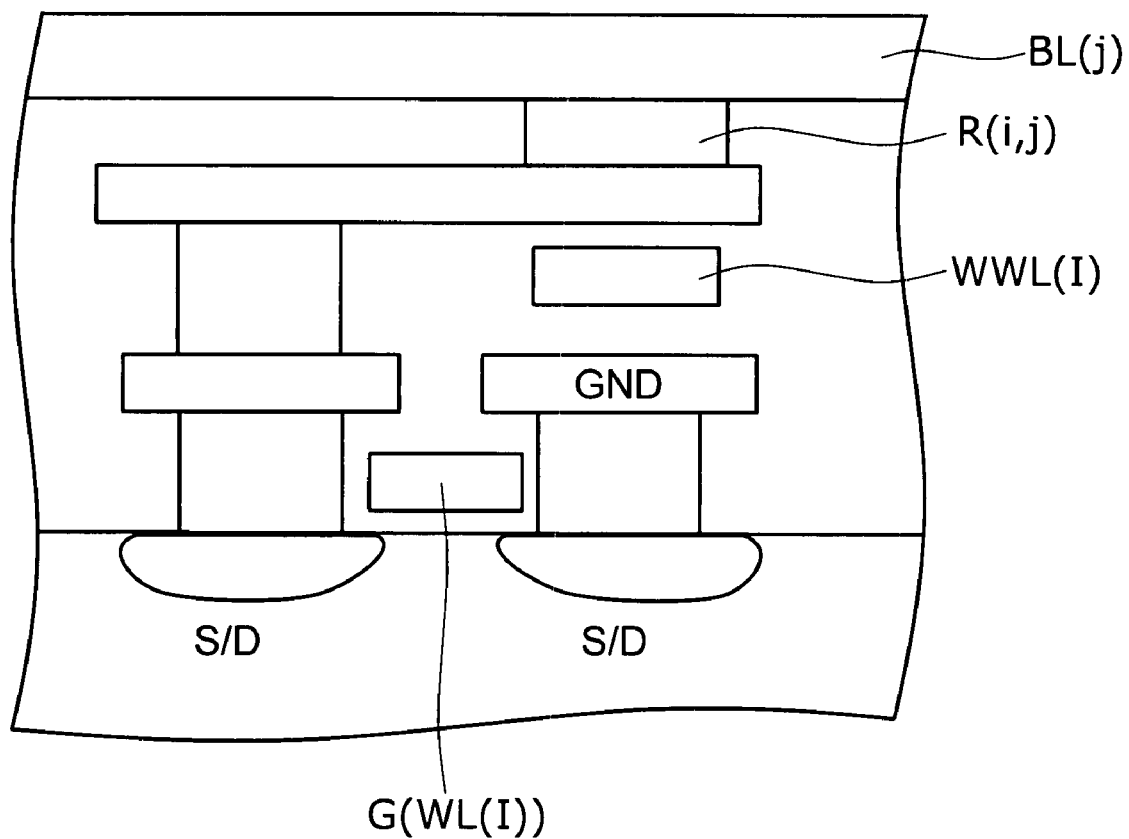
FIG. 20 is a schematic view illustrating an example cross-sectional structure of the word line WL(i), the bit line BL(j) and the write word line WWL(i).

FIG. 20 is a schematic view illustrating the cross-sectional structure of the word line WL(i) and the bit line BL(j) connected to the magnetic memory element R and the write word line WWL(i) placed near the magnetic memory element R.

Figure 21:
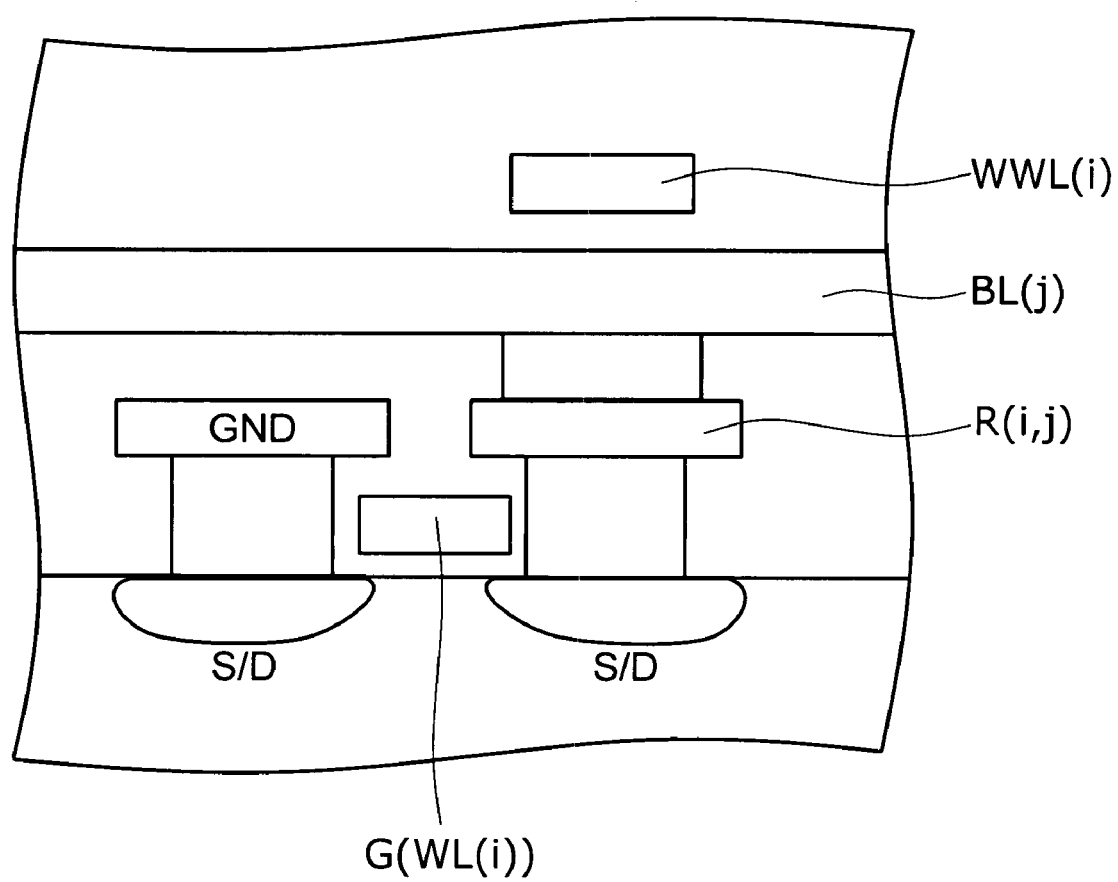
FIG. 21 is a schematic view showing another example cross-sectional structure of the word line WL(i), the bit line BL(j) and the write word line WWL(i).

FIG. 21 is a schematic view showing another example cross-sectional structure of the word line WL(i) and the bit line BL(j) connected to the memory cell and the write word line WWL(i) placed near the magnetic memory element R.

As shown in these figures, the magnetic memory apparatus of this embodiment additionally includes a write word line WWL placed near the magnetic memory element (memory cell) R. The write word line WWL is parallel to the word line WL and insulated from the magnetic memory element R. The magnetic memory element R may be the magnetic memory element R of the second embodiment, or the magnetic memory element R of the third embodiment with the magnetic field application section MA for generating current magnetic field.

The method for writing to the first memory layer FF1 in this embodiment is the same as that described above with reference to the second to fourth embodiment.

Figure 22:
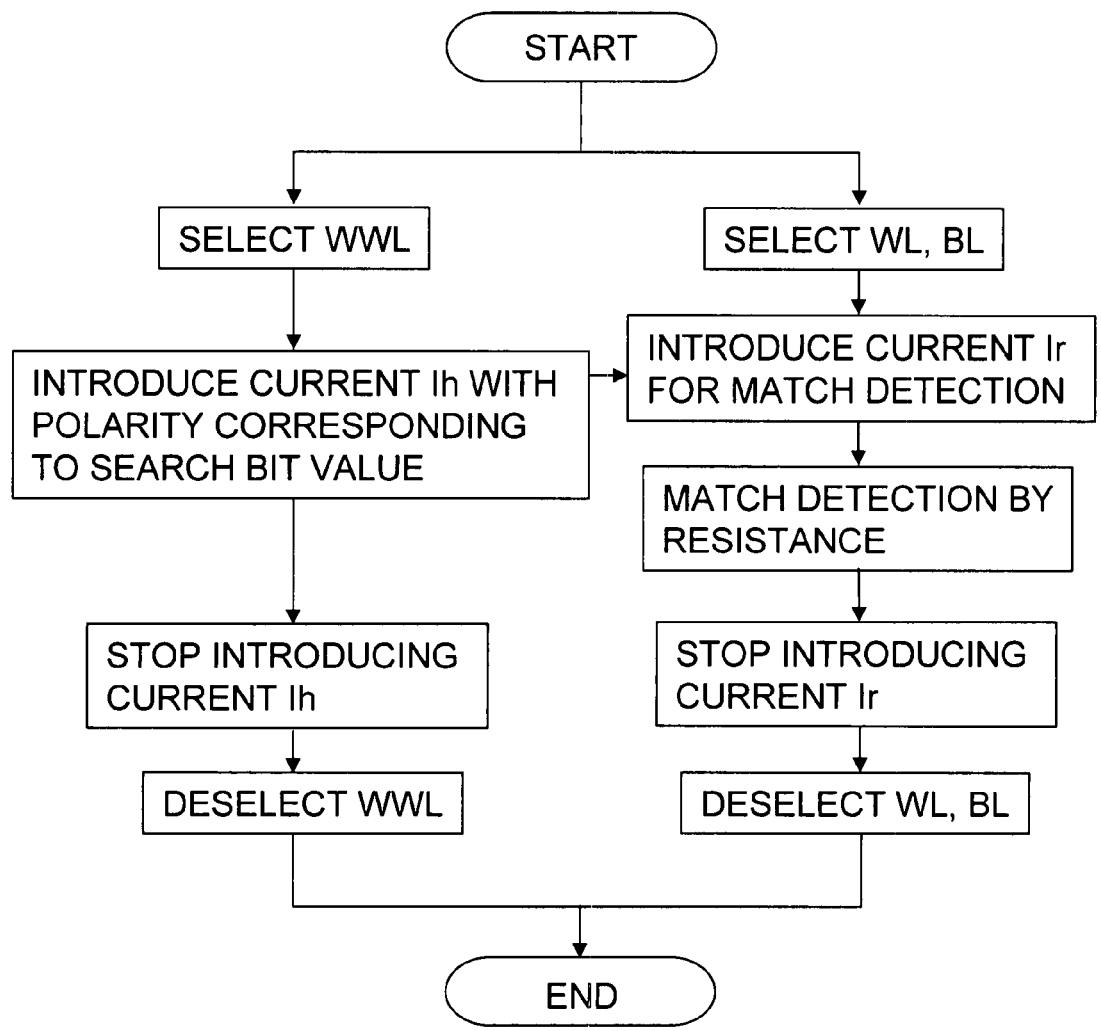
FIG. 22 is a flow chart showing a method for match detection of the second embodiment.

FIG. 22 is a flow chart showing a method for match detection for the magnetic memory element R of the second embodiment.

Writing to the second memory layer FF2 begins by using the decoder to select a write word line connected to the intended memory cell and passing a current therethrough. Upon passing a current Ih through the write word line WWL(i), a current magnetic field H is generated, and the same data is written to the second memory layer FF2 of the memory cells MC(i,1), MC(i,2), . . . , MC(i,n). By reversing the direction of current passed through the write word line WWL(i), the opposite data can be written to the memory cells.

Then a sense current Ir for match detection is passed, and match detection is performed by the magnetoresistance effect. Subsequently, the sense current Ir is stopped, and the word line WL, the bit line BL, and the write word line WWL are deselected.

Figure 23:
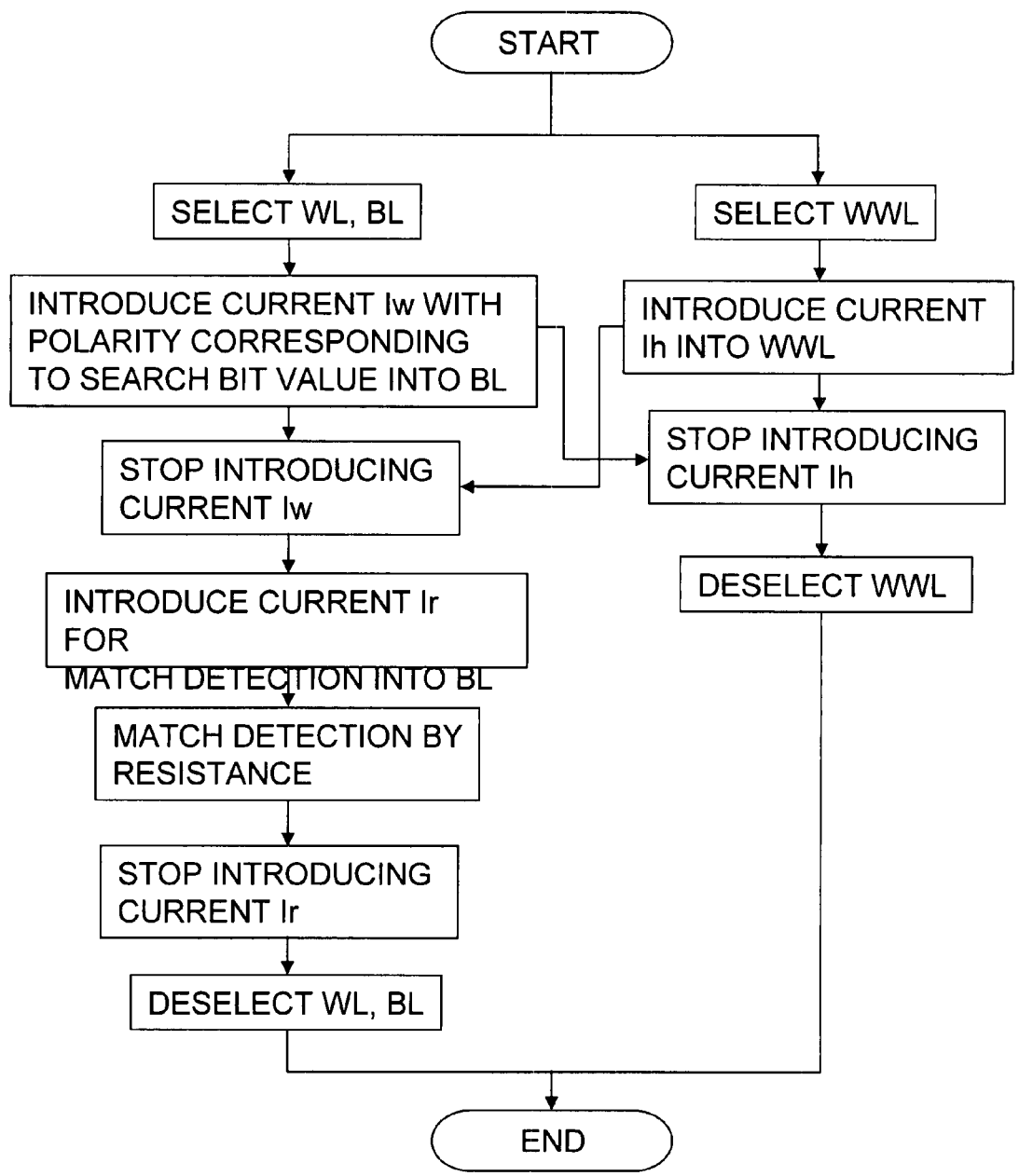
FIGS. 23 and 24 are flow charts showing a method for match detection of the third embodiment.

FIG. 23 is a flow chart showing a method for match detection for the magnetic memory element R of the third embodiment.

This example is adapted to a surrounding circuit S of the unipolar type. First, the word line WL, the bit line BL, and the write word line connected to the memory cell are selected by the decoder, and a current is passed therethrough. When a current Iw with the polarity corresponding to the value of a search bit is passed through the bit line BL and a current Ih is passed through the write word line WWL(i), a current magnetic field H is generated, and the search data is written to the second memory layer FF2 of the intended memory cell MC(i, j). Then the current Iw and the current Ih are stopped, and a sense current Ir is passed to perform match detection by the magnetoresistance effect. Subsequently, the sense current Ir is stopped, and the word line WL, the bit line BL, and the write word line WWL are deselected.

Figure 24:
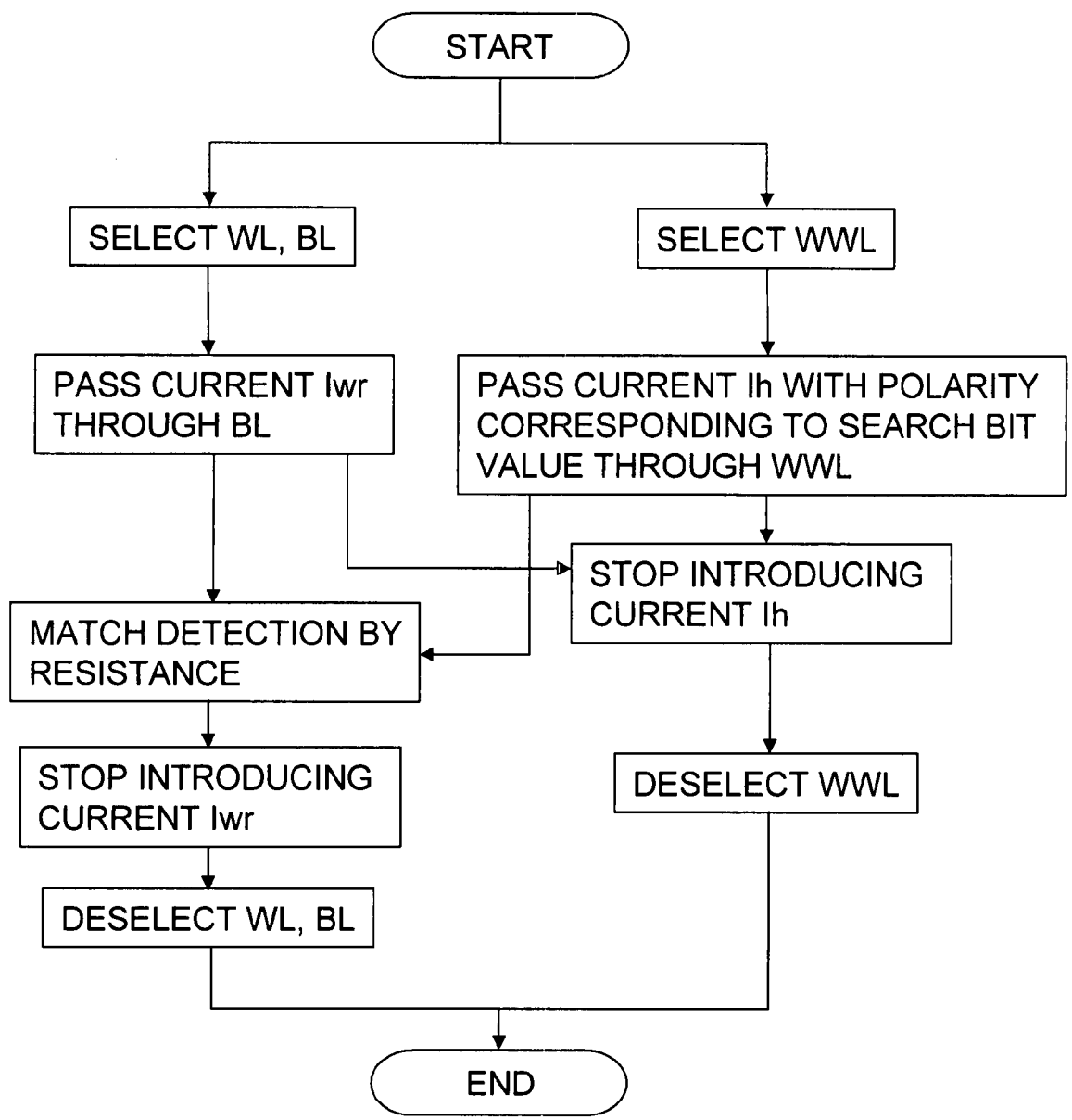

FIG. 24 is a flow chart showing another method for match detection for the magnetic memory element R of the third embodiment.

This example is adapted to a surrounding circuit S of the bipolar type. First, the word line WL, the bit line BL, and the write word line connected to the memory cell are selected by the decoder, and a current is passed therethrough. When a current Iwr with the polarity corresponding to the value of a search bit is passed through the bit line BL and a current Ih is passed through the write word line WWL(i), a current magnetic field H is generated, and the search data is written to the second memory layer FF2 of the intended memory cell MC(i, j). Then the current Ih is stopped, and the current Iwr is directly used as a sense current to perform match detection by the magnetoresistance effect. Subsequently, the current Iwr is stopped, and the word line WL, the bit line BL, and the write word line WWL are deselected.

As described above, this embodiment allows a magnetic memory apparatus in which magnetic memory elements R based on current magnetic field are arranged in an array configuration.

Figure 25:
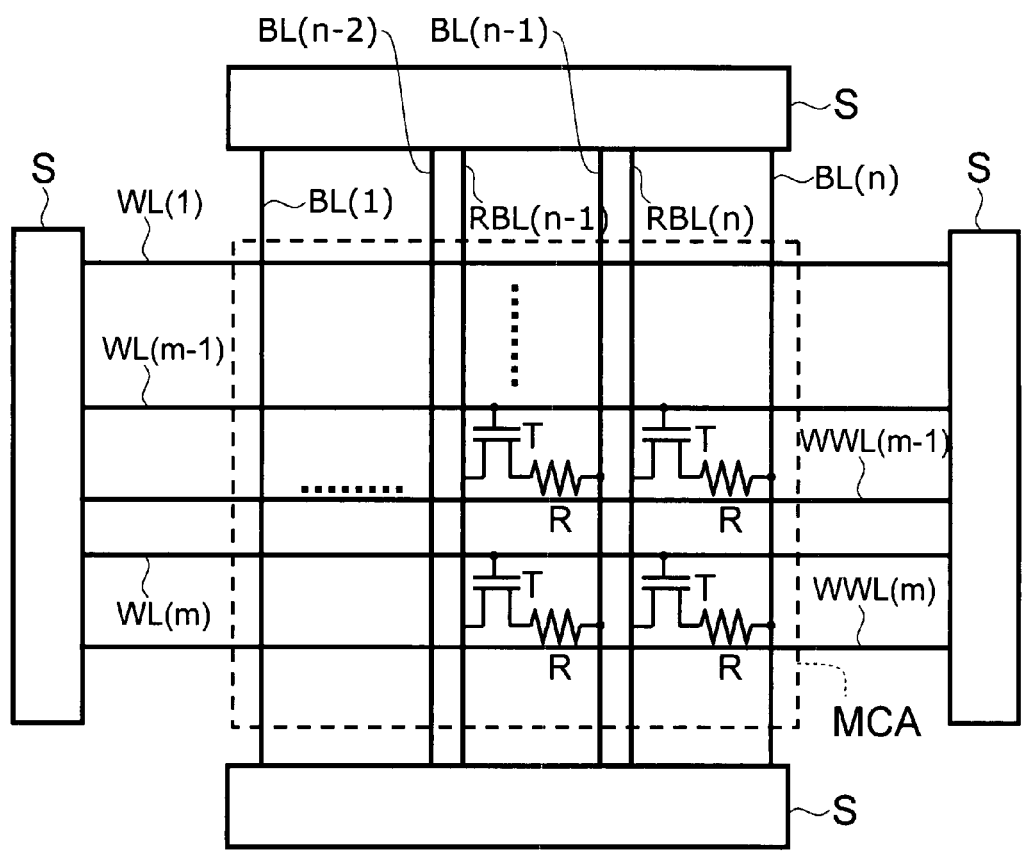
FIG. 25 is a schematic view showing a variation of the magnetic memory apparatus of the fifth embodiment.

FIG. 25 is a schematic view showing a variation of the magnetic memory apparatus of this embodiment.

In this variation, one of the main electrodes of the transistor T is not directly connected to the ground terminal or power supply terminal, but is connected to the read bit line RBL, which is connected to the ground terminal or power supply terminal through the surrounding circuit S. As described above with reference to FIGS. 17 and 18, this facilitates controlling the current passed through the magnetic memory element R via the transistor T.

Sixth Embodiment

Next, a sixth embodiment of the invention is described.

Figure 26:
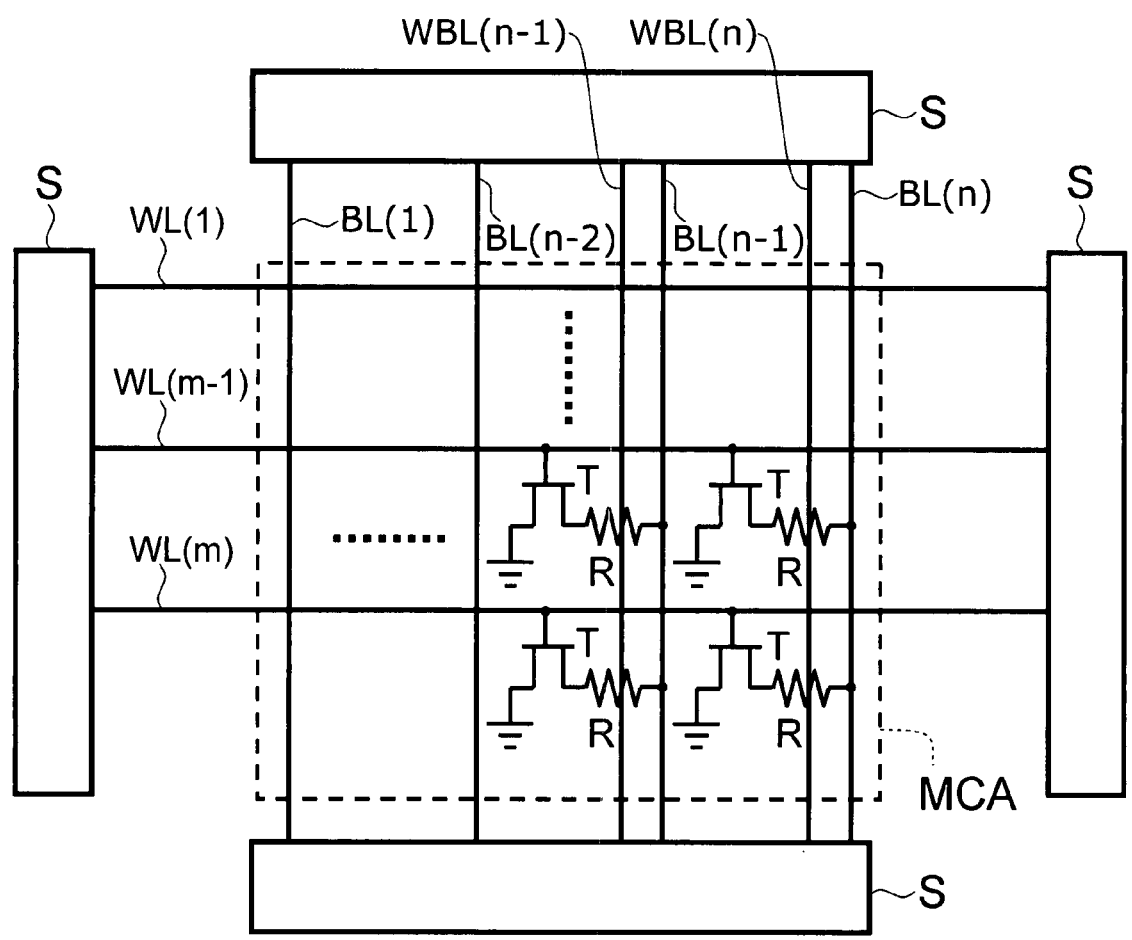
FIG. 26 is a schematic view showing a magnetic memory apparatus according to a sixth embodiment.

FIG. 26 is a schematic view showing a magnetic memory apparatus according to this embodiment.

In addition to the magnetic memory element R and the word line WL(i) and bit line BL(j) connected thereto, this embodiment includes a write bit line WBL(j) near the magnetic memory element R. That is, instead of the write word line WWL described above with reference to the fifth embodiment, a write bit line WBL is provided.

Figure 27:
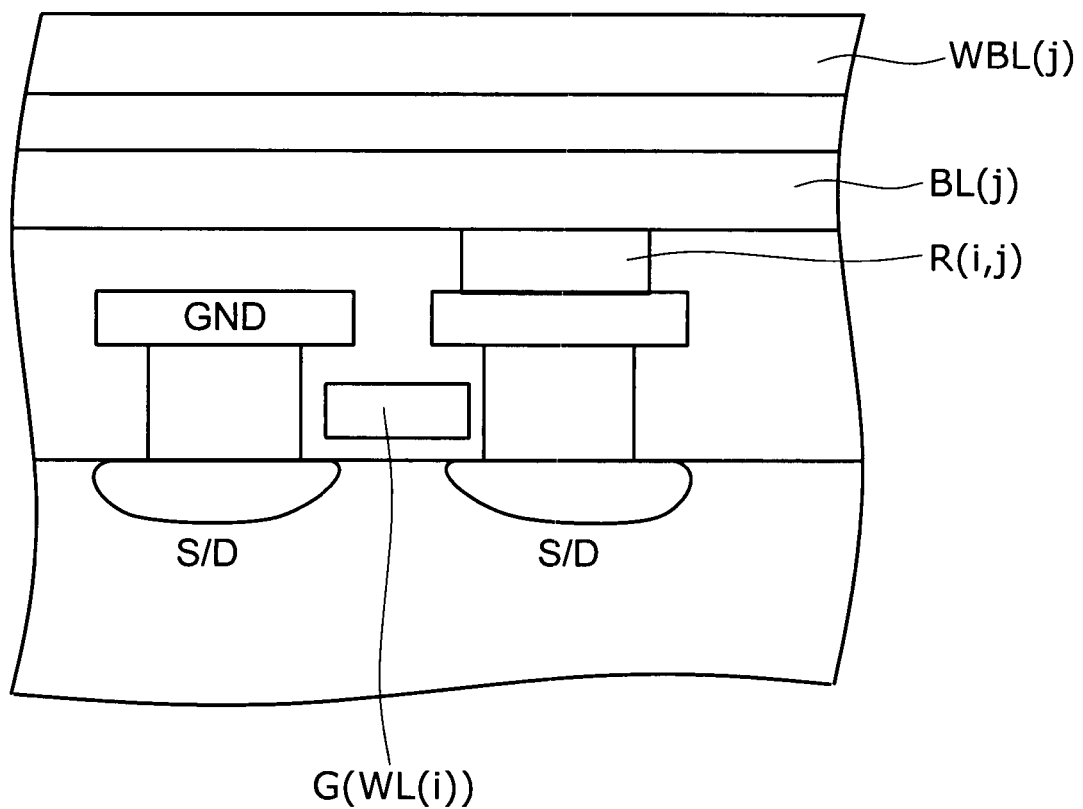
FIG. 27 is a schematic view illustrating the cross-sectional structure of the word line WL(i), the bit line BL(j) the write bit line WBL(j).

FIG. 27 is a schematic view illustrating the cross-sectional structure of the word line WL(i) and the bit line BL(j) connected to the magnetic memory element R and the write bit line WBL(j) placed near the magnetic memory element R.

Figure 28:
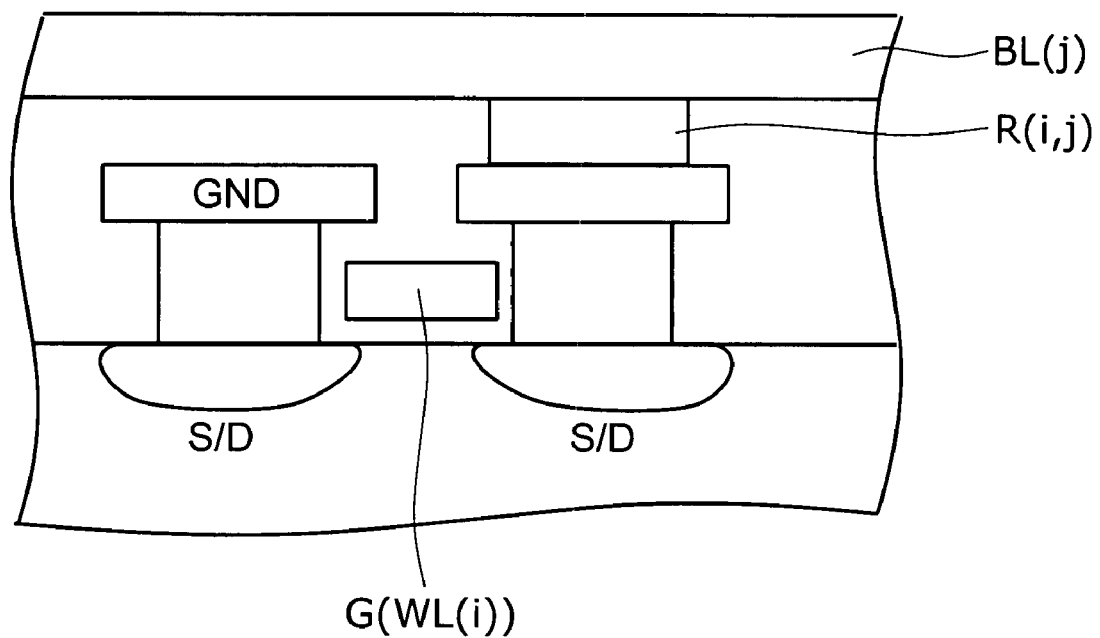
FIG. 28 is a schematic view showing another example cross-sectional structure of the word line WL(i), the bit line BL(j) and the write bit line WBL(j).

FIG. 28 is a schematic view showing the cross-sectional structure of a variation in which the write bit line WBL(j) is omitted.

As shown in FIGS. 26 and 27, the magnetic memory apparatus of this embodiment additionally includes a write bit line WBL placed near the magnetic memory element (memory cell) R. The write bit line WBL is parallel to the bit line BL and insulated from the magnetic memory element R. As with the fifth embodiment, the magnetic memory element R may be the magnetic memory element R of the second embodiment, or the magnetic memory element R of the third embodiment with the magnetic field application section MA for generating current magnetic field. In the variation shown in FIG. 28, the write bit line WBL is omitted, and instead a current is passed through the bit line BL to generate current magnetic field, thereby allowing writing to the magnetic memory element R.

The method for writing to the first memory layer FF1 in this embodiment is the same as that described above with reference to the second to fourth embodiment. The method for match detection in this embodiment is the same as that described above with reference to the fifth embodiment. In the present embodiment, a current Ih is passed through the write bit line WBL (or bit line BL) instead of through the write word line WWL to generate a current magnetic field H.

Figure 29:
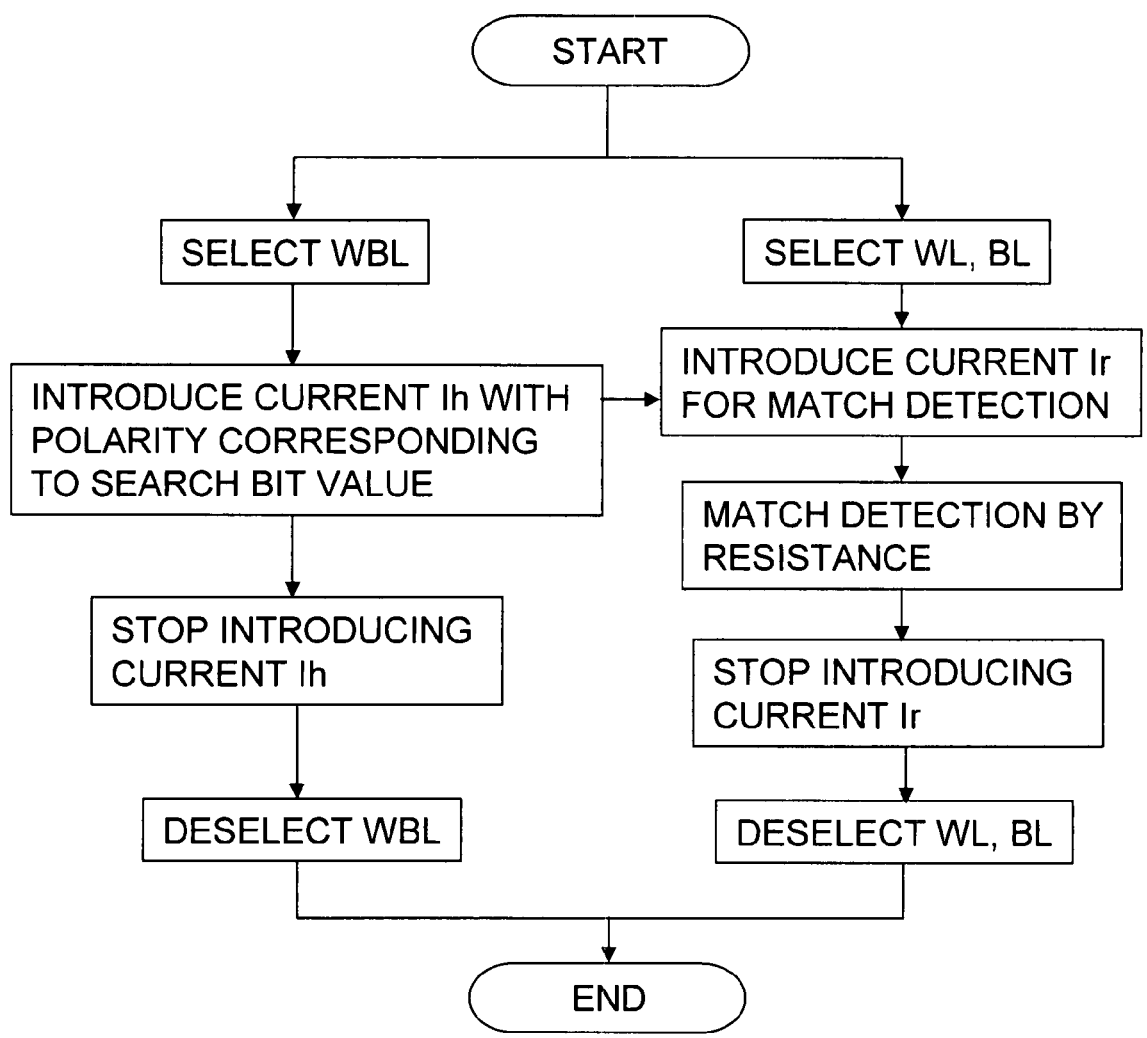
FIG. 29 is a flow chart showing a method for match detection for the magnetic memory element R of the second embodiment.

FIG. 29 is a flow chart showing a method for match detection for the magnetic memory element R of the second embodiment.

Writing to the second memory layer FF2 begins by using the decoder to select a write word line connected to the intended memory cell and passing a current therethrough. Upon passing a current Ih through the write bit line WBL(j), a current magnetic field H is generated, and the same data is written to the second memory layer FF2 of the memory cells MC(1,j), MC(2,j), . . . , MC(m,j). By reversing the direction of current passed through the write bit line WBL(j), the opposite data can be written to the memory cells.

Then a sense current Ir for match detection is passed, and match detection is performed by the magnetoresistance effect. Subsequently, the sense current Ir is stopped, and the word line WL, the bit line BL, and the write bit line WBL are deselected. In the variation shown in FIG. 28, a current Ih is passed through the bit line BL instead of through the write bit line WBL.

Figure 30:
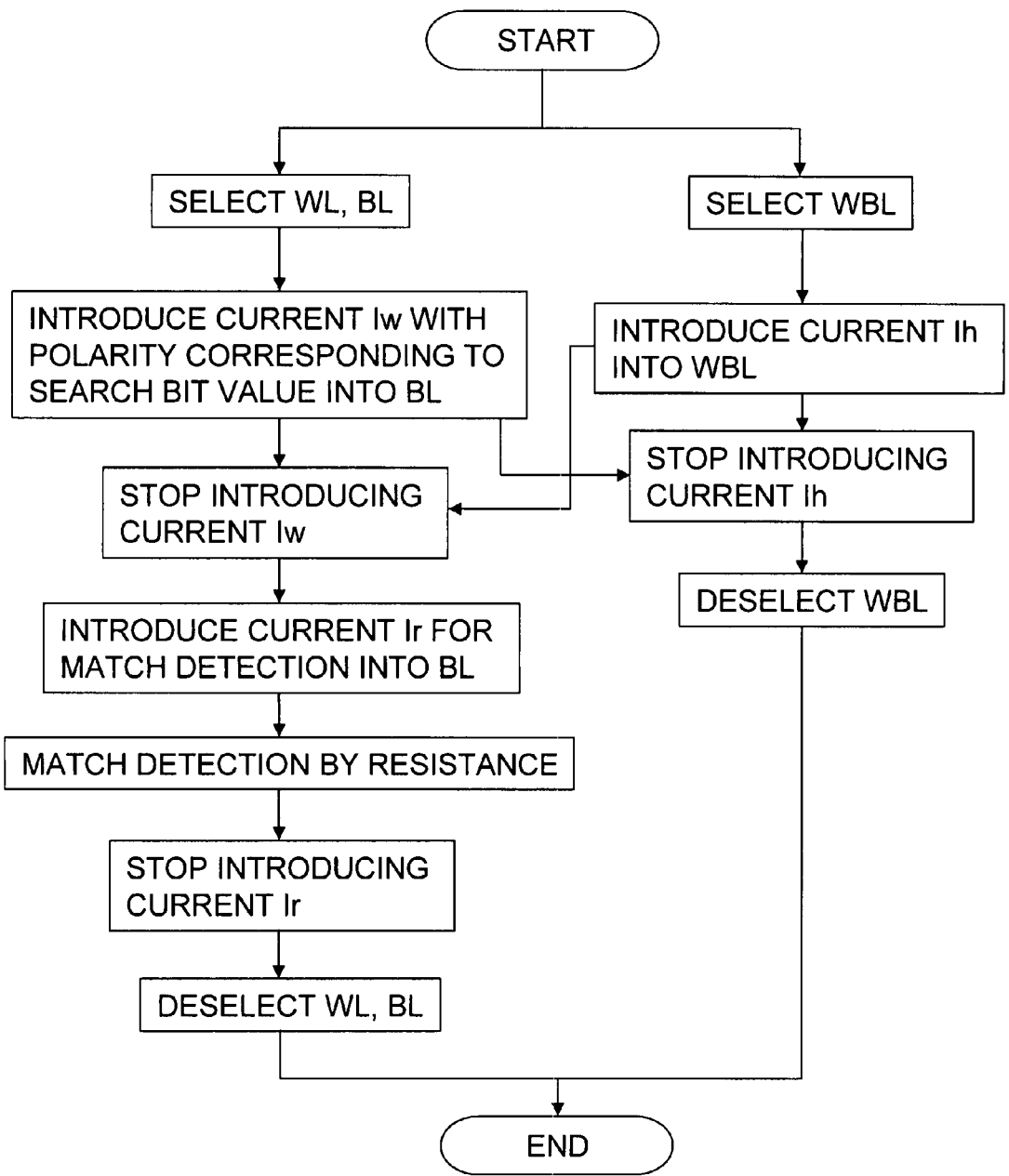
FIGS. 30 and 31 are flow charts showing a method for match detection for the magnetic memory element R of the third embodiment.

FIG. 30 is a flow chart showing a method for match detection for the magnetic memory element R of the third embodiment.

This example is adapted to a surrounding circuit S of the unipolar type. First, the word line WL, the bit line BL, and the write bit line connected to the memory cell are selected by the decoder, and a current is passed therethrough. When a current Iw with the polarity corresponding to the value of a search bit is passed through the bit line BL and a current Ih is passed through the write bit line WBL(j), a current magnetic field H is generated, and the search data is written to the second memory layer FF2 of the intended memory cell MC(i,j). Then the current Iw and the current Ih are stopped, and a sense current Ir is passed to perform match detection by the magnetoresistance effect. Subsequently, the sense current Ir is stopped, and the word line WL, the bit line BL, and the write bit line WBL are deselected.

Figure 31:
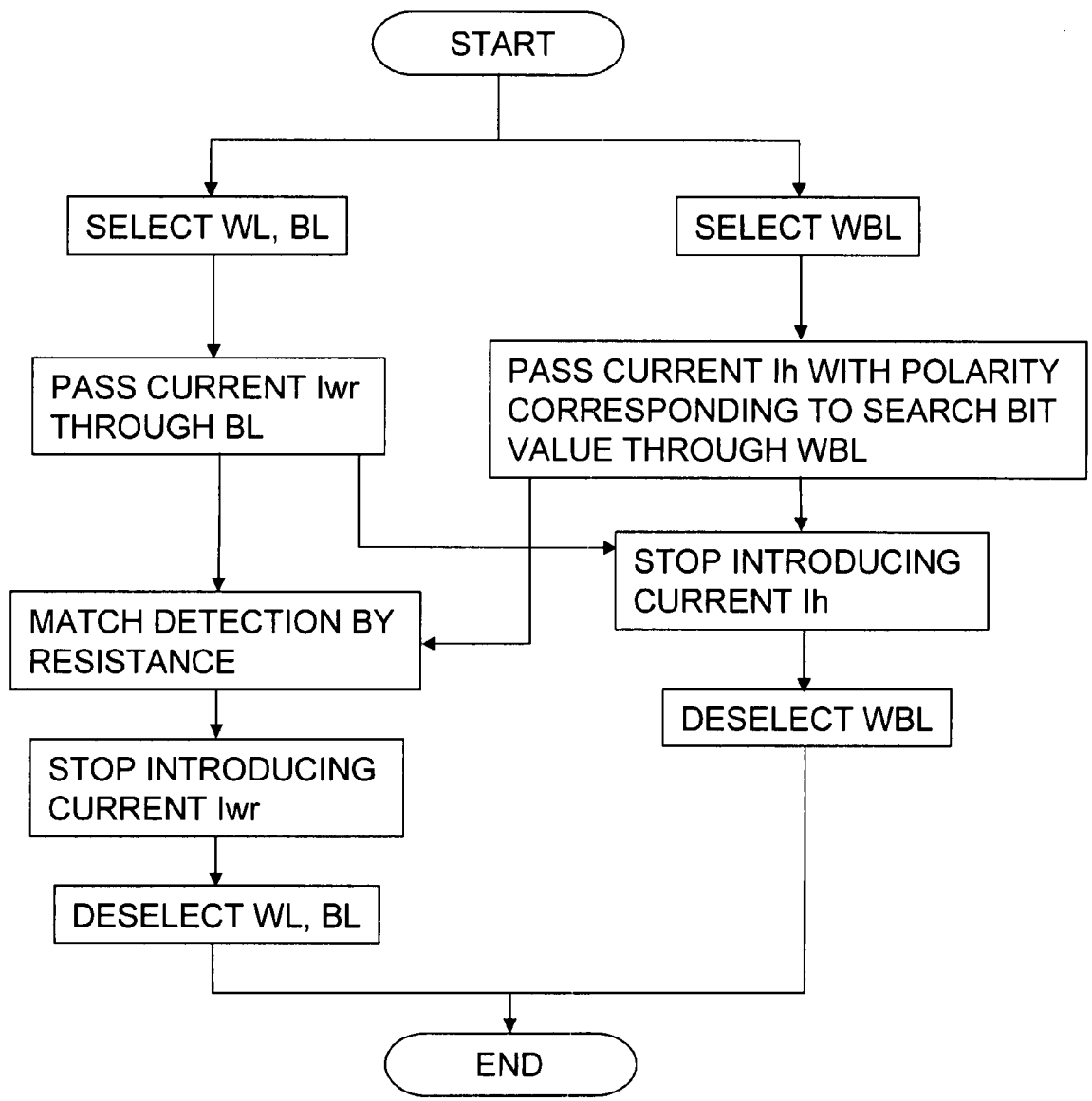

FIG. 31 is a flow chart showing another method for match detection for the magnetic memory element R of the third embodiment.

This example is adapted to a surrounding circuit S of the bipolar type. First, the word line WL, the bit line BL, and the write bit line connected to the memory cell are selected by the decoder, and a current is passed therethrough. When a current Iwr with the polarity corresponding to the value of a search bit is passed through the bit line BL and a current Ih is passed through the write bit line WBL(j), a current magnetic field H is generated, and the search data is written to the second memory layer FF2 of the intended memory cell MC(i,j). Then the current Ih is stopped, and the current Iwr is directly used as a sense current to perform match detection by the magnetoresistance effect. Subsequently, the current Iwr is stopped, and the word line WL, the bit line BL, and the write bit line WBL are deselected.

As described above, this embodiment allows a magnetic memory apparatus in which magnetic memory elements R based on current magnetic field are arranged in an array configuration.

Figure 32:
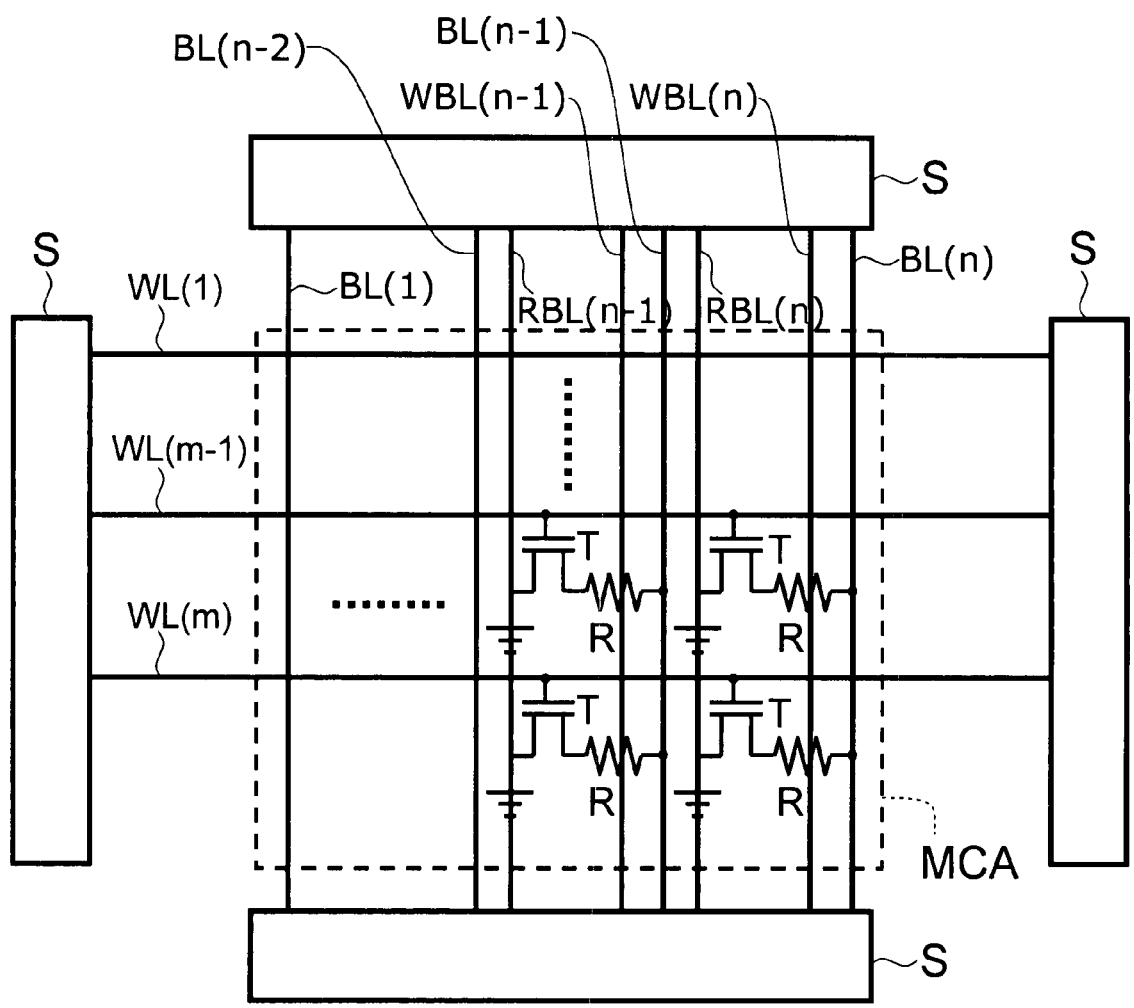
FIG. 32 is a schematic view showing a variation of the magnetic memory apparatus of the sixth embodiment.

FIG. 32 is a schematic view showing a variation of the magnetic memory apparatus of this embodiment.

In this variation, one of the main electrodes of the transistor T is not directly connected to the ground terminal or power supply terminal, but is connected to the read bit line RBL, which is connected to the ground terminal or power supply terminal through the surrounding circuit S. As described above with reference to FIGS. 17 and 18, this facilitates controlling the current passed through the magnetic memory element R via the transistor T.

Seventh Embodiment

Figure 33:
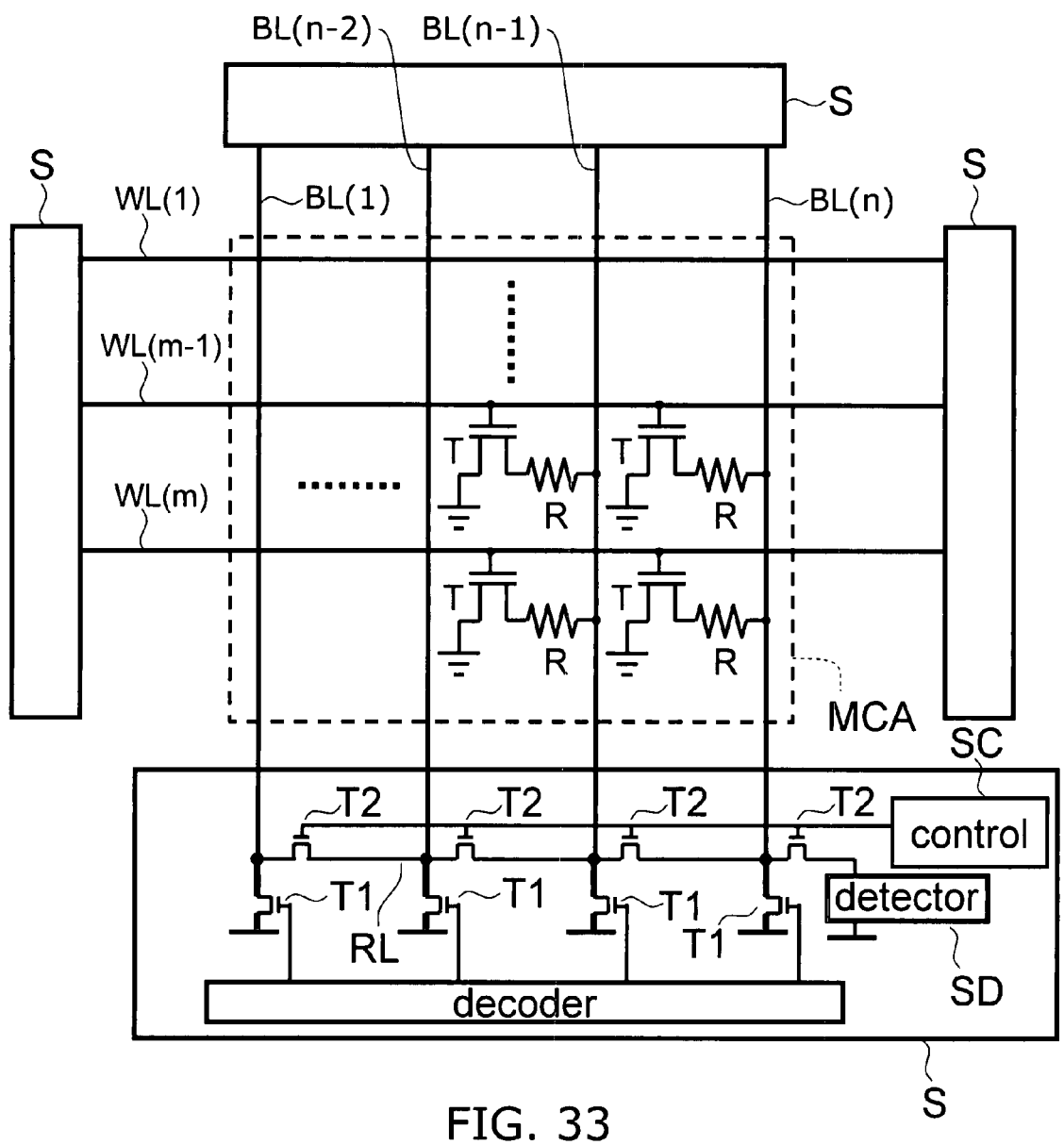
FIG. 33 is a schematic view showing a magnetic memory apparatus according to a seventh embodiment.

Next, a seventh embodiment of the invention is described.
FIG. 33 is a schematic view showing a magnetic memory apparatus according to this embodiment.

In the magnetic memory apparatus according to the fourth to sixth embodiment, match detection between the first memory layer FF1 and the second memory layer FF2 is performed for each memory cell by specifying a row and a column. In contrast, in the present embodiment, a matching degree can be detected collectively at a time for a plurality of memory cells in one row.

The "matching degree" used herein is a quantity defined by k/n, where among n memory cells, a match is found in k memory cells between the data stored in the first memory layer FF1 and the second memory layer FF2, while no match is found in the remaining (n−k) memory cells. Hence the matching degree depends only on the number of matching memory cells, and is not directly affected by whether a match is found in a particular memory cell.

In the magnetic memory apparatus shown in FIG. 33, each bit line BL(j) is branched in the surrounding circuit S. One branch of the bit line is connected to a switch element T1(j), the gate of which is connected to the decoder. The other branch of the bit line BL is connected to an interconnect RL common to the bit lines through a switch element T2(j). The switch elements T2(1), . . . , T2(n) are simultaneously turned on/off by an ENABLE signal from a control circuit SC.

The method for writing to the first memory layer FF1 in this embodiment is the same as that described above with reference to the fourth embodiment.

On the other hand, writing to the second memory layer FF2 in this embodiment can be performed before detecting the matching degree. In this case, the method for writing to the second memory layer FF2 is the same as that described above with reference to the fourth embodiment. Furthermore, this embodiment may include write bit lines WBL as described above with reference to the sixth embodiment. In this case, writing to the second memory layer FF2 of the memory cells connected to the same write bit line WBL is simultaneously performed.

The method for detecting the matching degree in this embodiment is described.

First, the word line WL of the row to be read is selected, and the transistor T in the memory cells connected to this word line WL is turned on. Next, or simultaneously, T1 and T2 connected to each column are turned off and on, respectively. Thus a current flows through the bit lines BL(1), . . . , BL(n), and the total current thereof flows through the interconnect RL. Hence, by a current detection circuit SD, the magnitude of the combined resistance of parallel connected memory cells MC(i,1), . . . , MC(i,n) can be detected.

Among MC(i,1), . . . , MC(i,n), the magnetization directions of the first memory layer FF1 and the second memory layer FF2 are parallel in k memory cells. Hence the electric resistance of each of the memory cells has a small value RL. In the remaining (n−k) memory cells, the magnetization directions of the first memory layer FF1 and the second memory layer FF2 are antiparallel. Hence the electric resistance of each of the memory cells has a large value RH. Then the combined resistance is 1/(k/RL+(n−k)/RH). That is, the electric resistance is RL/n for a matching degree of 1 (k=n), RH/n for a matching degree of 0 (k=0), and a value greater than RL/n and less than RH/n in the other general cases.

FIG. 34 is a schematic view showing an example of the magnetic memory apparatus of this embodiment.

In this example, a capacitor C is commonly connected to each bit line BL via a transistor Tc. The transistor Tc is turned on/off under the control of a controller BC.

Figure 34A:
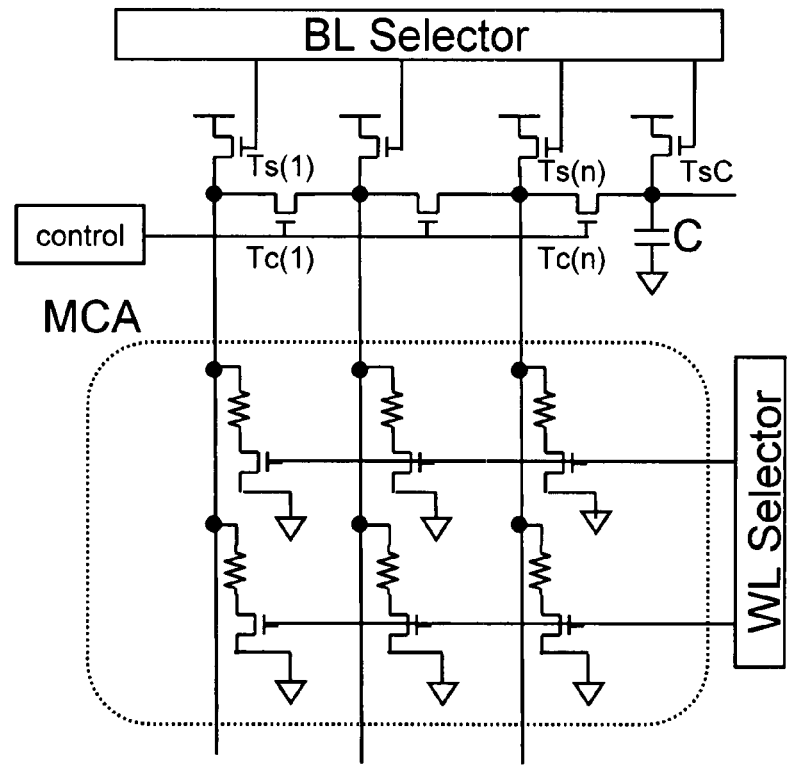
FIG. 34 is a schematic view showing an example of the magnetic memory apparatus of the seventh embodiment.

During standby, as shown in FIG. 34A, the select transistors Ts(1), . . . , Ts(n) are turned off, and the transistor Tsc is turned on to charge the capacitor C. At the time of writing to the first memory layer FF1, one word line WL is selected, a select transistor Ts(j) is turned on to select a bit line, the other select transistors Ts are turned off, and the transistors Tc(1), . . . , Tc(n) are turned off. Thus writing to a desired memory cell is performed by the method described above with reference to the first to third embodiment.

Figure 34B:
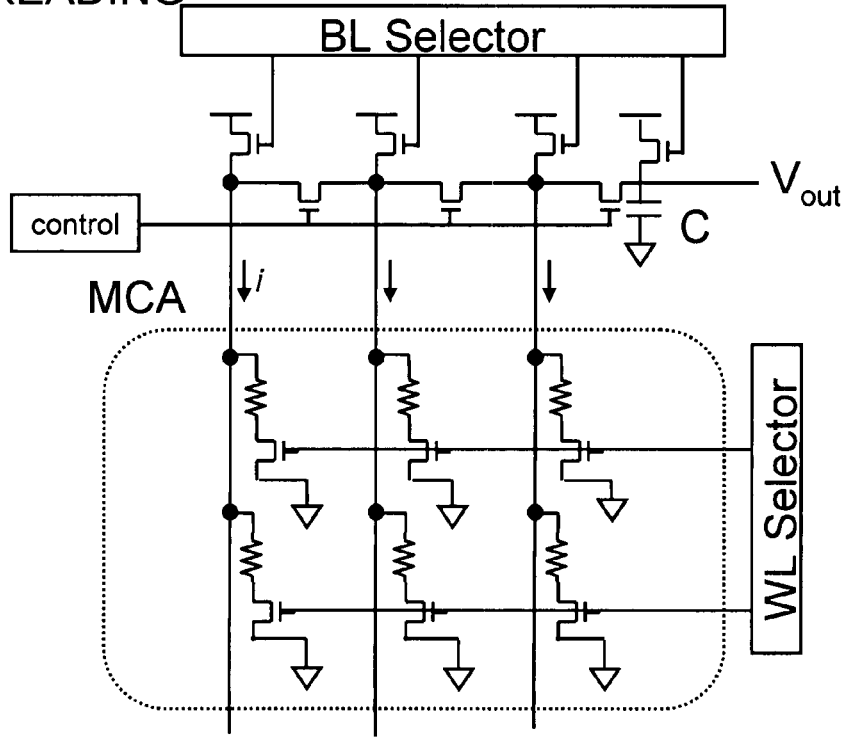

On the other hand, at the time of match detection, as shown in FIG. 34B, one word line WL(i) is selected, the select transistors Ts(1), . . . , Ts(n) and the transistor Tsc are turned off, and the transistors Tc(1), . . . , Tc(n) are turned on. Then discharge occurs from the capacitor C to the memory cells MC(i,1), . . . , MC(i,n). At this time, the output potential Vout is attenuated with time, and the attenuation time constant is the product of R and C, where R is the combined resistance of the parallel connected memory cells MC(i,1), . . . , MC(i,n) and C is the capacitance of the capacitor. Hence it is possible to detect the magnitude of the combined resistance by detecting the output potential. Vout at a certain time. The magnitude of the combined resistance represents the matching degree.

Eighth Embodiment

Next, an eighth embodiment of the invention is described.

Figure 35:
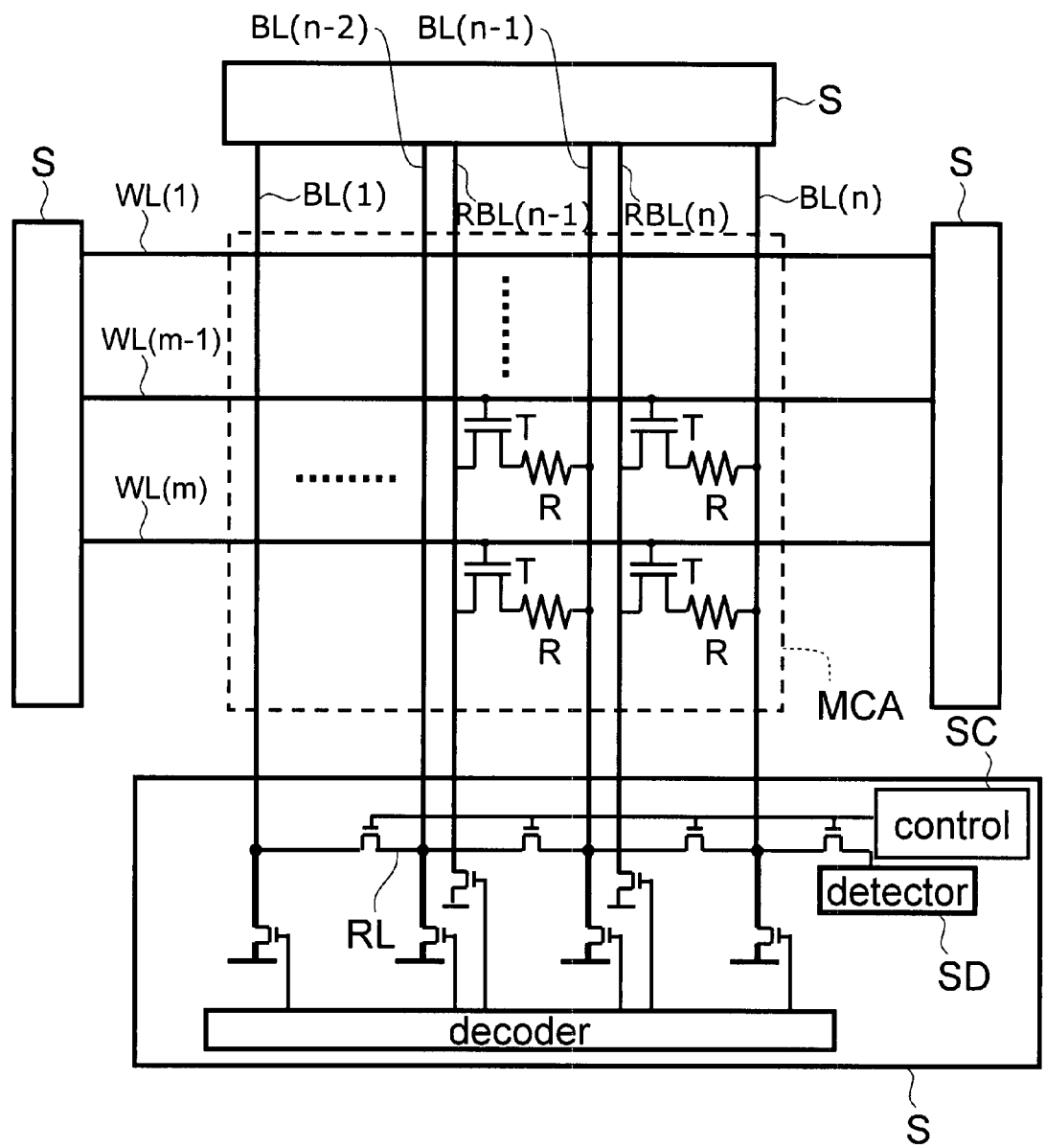
FIG. 35 is a schematic view showing a magnetic memory apparatus according to an eighth embodiment.

FIG. 35 is a schematic view showing a magnetic memory apparatus according to this embodiment.

This embodiment includes read bit lines RBL described above with reference to FIGS. 17 and 32. Also in this case, the matching degree can be detected as described above with reference to the seventh embodiment. Furthermore, the matching degree can be detected also when write bit lines WBL are provided as in FIG. 32.

Figure 36:
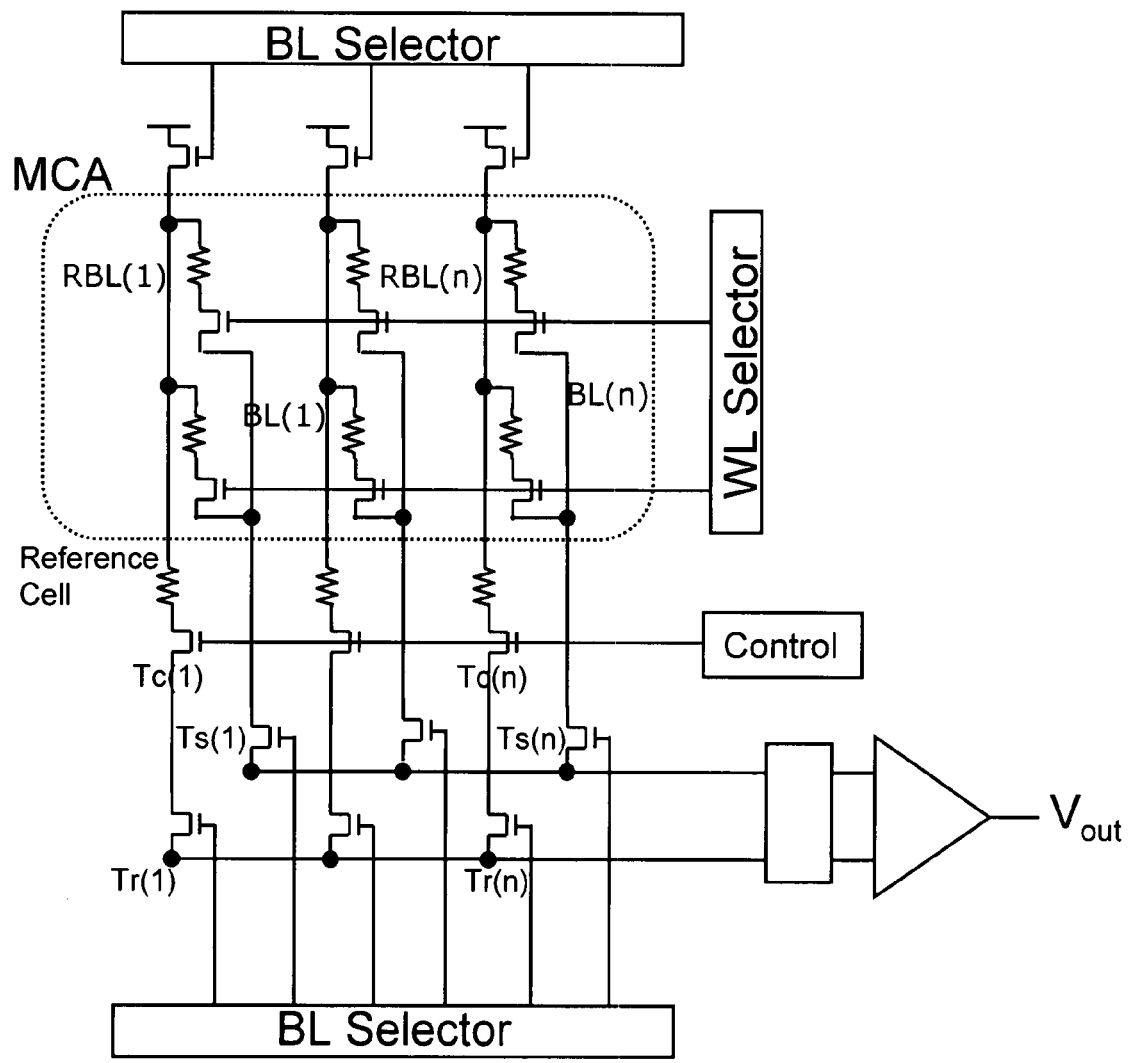
FIG. 36 is a schematic view showing a variation of the magnetic memory apparatus of the eighth embodiment.

FIG. 36 is a schematic view showing a variation of the magnetic memory apparatus of this embodiment.

The magnetic memory apparatus of this variation is the same as that described above with reference to FIG. 18 except that a plurality of bit lines can be simultaneously selected. Here "a plurality of bit lines" may be all the bit lines, or may be part of all the bit lines.

Ninth Embodiment

Next, a ninth embodiment of the invention is described.

Figure 37:
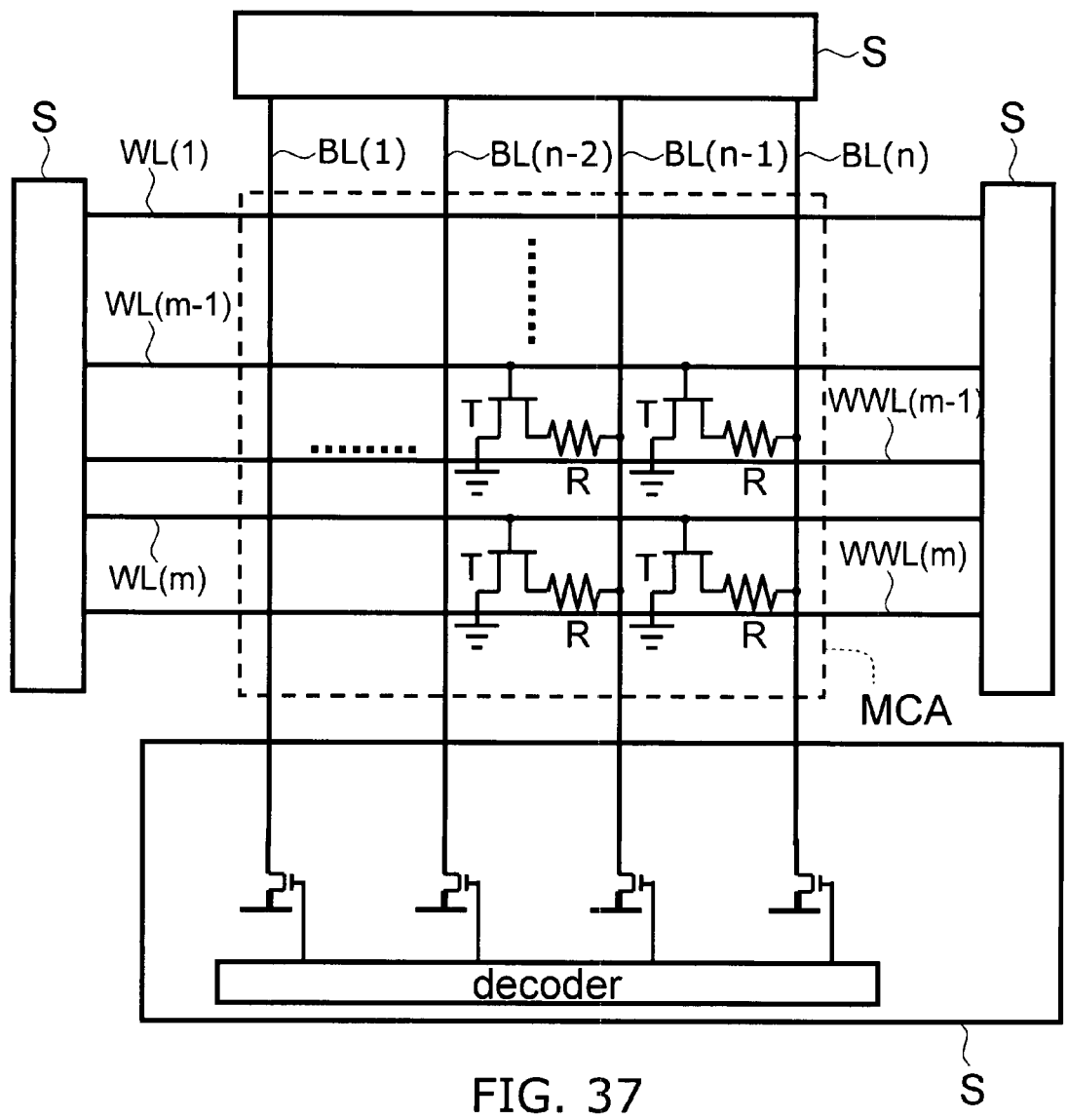
FIG. 37 is a schematic view showing a magnetic memory apparatus according to a ninth embodiment.

FIG. 37 is a schematic view showing a magnetic memory apparatus according to this embodiment.

The magnetic memory apparatus of this embodiment can detect the matching degree for a plurality of memory cells on one column (bit line). Writing to the first memory layer FF1 and the second memory layer FF2 in this embodiment is the same as that described above with reference to FIGS. 12 and 19.

The operation of detecting the matching degree can be performed after or simultaneously with writing to the second memory layer FF2 as described above with reference to the fourth embodiment.

The method for detecting the matching degree is described in the following.

First, all the word lines WL(1), . . . , WL(m) are selected, and the transistors of all the memory cells are turned on. Next, or simultaneously, the bit line BL(j) is turned on to pass a current through the bit line BL(j). Then it is possible to detect the electric resistance of the parallel connected memory cells MC(1,j), . . . , MC(m,j) and to detect the matching degree. Specifically, when a match is found in k out of m memory cells, the combined resistance is $1/(k/RL+(m-k)/RH)$. Typically, to detect electric resistance, a fixed resistance is serial connected to pass a fixed current for detecting the voltage between the resistance to be detected and the fixed resistance. Alternatively, a fixed voltage is applied and the resulting current is detected. These methods can be used also in this embodiment.

Furthermore, this embodiment also allows the magnetic memory apparatus described above with reference to FIGS. 17 and 25 to similarly detect the matching degree for a plurality of memory cells on one column (bit line).

Tenth Embodiment

Next, a tenth embodiment of the invention is described.

In the magnetic memory elements according to the first and second embodiment, a multi-domain structure can be formed in at least one of the first and second memory layers FF1 and FF2 by flowing a current which is smaller than the switching threshold current, in the case where data writing is performed by flowing a current. The current can be flown in either direction. When at least one of the first and second memory layers FF1 and FF2 has the multi-domain structure, a medium resistance, which is in between a resistance when the memory layers FF1 and FF2 are parallel and a resistance when the memory layers FF1 and FF2 are antiparallel, can be obtained by performing the detection of the matching degree by using the method as described with regard to the first embodiment. That is, three different states can be written to the magnetic memory element of the embodiment.

Such a multi-domain structure can be more easily formed by using a material for perpendicular magnetization for the memory layers FF1 and/or FF2. In the case where data writing is performed by applying a magnetic field, such a multi-domain structure can be formed by applying a magnetic field which is smaller than a switching threshold magnetic field, thus, a multivalued operation can be performed. In this case, the magnetic field can be applied in either direction.

Eleventh Embodiment

Next, an eleventh embodiment of the invention is described.

By using the magnetic memory element of the tenth embodiment for the magnetic memory apparatus according to the fourth, fifth and sixth embodiments, a ternary CAM (content addressable memory) can be realized. The ternary CAM is the CAM which outputs a same constant value regardless of the content of stored data bit by writing a "don't care" bit which is not "0" nor "1" as a search bit.

In the case of the magnetic memory apparatus of the present embodiment, when the "don't care" bit is included in a search bit string, the aforementioned multi-domain structure is formed in the second memory layer by writing to the second memory layer of the corresponding magnetic memory element, as explained with regard to the tenth embodiment.

When the "don't care" bit is written in the second memory layer, the resistance of the magnetic memory element becomes medium value RM, which is between the high resistance RH and the low resistance RL.

In the detection of the matching degree, the reference resistance for comparing with the detected resistance is set to be in between RH and RM, or in between RM and RL.

Therefore, a same constant value is always obtained by a comparison, without distinction of the value stored in the first memory layer of the element.

The embodiments of the invention have been described with reference to the examples. However, the invention is not limited to these examples. For example, any variations in the specific dimensions and material of each component constituting the magnetic memory element and in the shape and material of the electrode, passivation, and insulation structures are encompassed within the scope of the invention as long as those skilled in the art can appropriately select them from known ones to similarly practice the invention and to achieve similar effects.

Furthermore, the structure of the magnetic memory element shown in the figures with reference to the first to third embodiment can be vertically reversed. The antiferromagnetic layer, intermediate layer, insulating layer, and other components in the magnetic memory element may be configured as a monolayer, or may have a laminated structure composed of two or more layers.

Furthermore, the magnetization direction can be oblique to the first pinned layer, the second pinned layer, the first memory layer and the second memory layer as well as parallel or perpendicular to the layers as shown in the figures with reference to the first to third embodiment.

Any magnetic memory elements and recording/reproducing apparatuses that can be appropriately adapted and implemented by those skilled in the art on the basis of the magnetic memory elements and magnetic memory apparatuses described above as the embodiments of the invention are encompassed within the scope of the invention as long as they include the features of the invention. Other variations and modifications that can be conceived by those skilled in the art within the spirit of the invention are also encompassed within the scope of the invention.

It is assumed herein that "perpendicular" includes deviations from being exactly perpendicular due to variations occurring in manufacturing processes. Likewise, "parallel" and "horizontal" does not necessarily mean being exactly parallel and horizontal, respectively.

The invention claimed is:

1. A magnetic memory element comprising:
   a first pinned layer including ferromagnetic material and having a fixed magnetization direction;
   a second memory layer including ferromagnetic material and having a variable magnetization direction;
   a first memory layer provided between the first pinned layer and the second memory layer, including ferromagnetic material, and having a variable magnetization direction;
   a first intermediate layer provided between the first pinned layer and the first memory layer and made of nonmagnetic material;
   a second intermediate layer provided between the first memory layer and the second memory layer and made of nonmagnetic material;
   a pair of electrodes electrically connected to pass a current between the first pinned layer and the second memory layer; and
   a magnetic field application section for applying magnetic field to the second memory layer,
   the magnetization direction of the first memory layer taking a first direction when the current exceeds a first threshold in a first polarity, and taking a second direction opposite to the first direction when the current exceeds a second threshold in a second polarity, and
   the magnetization direction of the second memory layer being changed to one of a third direction and a fourth direction depending on the magnetic field applied by the magnetic field application section without changing the magnetization direction of the first memory layer.

2. The element according to claim 1, wherein the second intermediate layer is made of insulator.

3. A magnetic memory apparatus comprising:
   a plurality of word lines;
   a plurality of bit lines; and
   a plurality of the magnetic memory elements,
   the magnetic memory element including:
   a first pinned layer including ferromagnetic material and having a fixed magnetization direction;
   a second memory layer including ferromagnetic material and having a variable magnetization direction;
   a first memory layer provided between the first pinned layer and the second memory layer, including ferromagnetic material, and having a variable magnetization direction;
   a first intermediate layer provided between the first pinned layer and the first memory layer and made of nonmagnetic material;
   a second intermediate layer provided between the first memory layer and the second memory layer and made of nonmagnetic material;
   a pair of electrodes electrically connected to pass a current between the first pinned layer and the second memory layer; and
   a magnetic field application section for applying magnetic field to the second memory layer,
   the magnetization direction of the first memory layer taking a first direction when the current exceeds a first threshold in a first polarity, and taking a second direction opposite to the first direction when the current exceeds a second threshold in a second polarity, and
   the magnetization direction of the second memory layer being changed to one of a third direction and a fourth direction depending on the magnetic field applied by the magnetic field application section without changing the magnetization direction of the first memory layer.

4. The apparatus according to claim 3, wherein
   one of the plurality of word lines and one of the plurality of bit lines are selected to pass a current between the pair of electrodes of one of the plurality of the magnetic memory elements and to apply the magnetic field from the magnetic field application section, thereby allowing the magnetization direction of the second memory layer thereof to take one of the third direction and the fourth direction, and
   one of the plurality of word lines and one of the plurality of bit lines are selected to pass a current between the pair of electrodes of one of the plurality of the magnetic memory elements, thereby allowing the magnetization direction of the first memory layer thereof to take one of the first direction and the second direction and allowing magnetoresistance effect between the first memory layer and the second memory layer to be detected.

5. The apparatus according to claim 3, wherein
   one of the plurality of word lines and one of the plurality of bit lines are selected to pass a current between the pair of electrodes of one of the plurality of the magnetic memory elements and to apply the magnetic field from the magnetic field application section, thereby allowing the magnetization direction of the second memory layer thereof to take one of the third direction and the fourth direction, and one of the plurality of word lines and one of the plurality of bit lines is selected to pass a current between the pair of electrodes of the magnetic memory elements connected thereto, thereby allowing the magnetization direction of the first memory layer thereof to take one of the first direction and the second direction and allowing combined resistance of the magnetic memory elements connected thereto to be detected.

6. The apparatus according to claim 4, wherein the magnetic field application section can apply the magnetic field to two or more of the plurality of the magnetic memory elements.

7. The apparatus according to claim 5, wherein the magnetic field application section can apply the magnetic field to two or more of the plurality of the magnetic memory elements.

* * * * *